(12) United States Patent
Sei et al.

(10) Patent No.: US 11,462,685 B2
(45) Date of Patent: Oct. 4, 2022

(54) SWITCH DEVICE, STORAGE APPARATUS, AND MEMORY SYSTEM INCORPORATING BORON AND CARBON

(71) Applicant: SONY SEMICONDUCTOR SOLUTIONS CORPORATION, Kanagawa (JP)

(72) Inventors: Hiroaki Sei, Kanagawa (JP); Kazuhiro Ohba, Tokyo (JP); Shuichiro Yasuda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 106 days.

(21) Appl. No.: 16/975,630

(22) PCT Filed: Jan. 31, 2019

(86) PCT No.: PCT/JP2019/003426
§ 371 (c)(1),
(2) Date: Aug. 25, 2020

(87) PCT Pub. No.: WO2019/167538
PCT Pub. Date: Sep. 6, 2019

(65) Prior Publication Data
US 2020/0411759 A1 Dec. 31, 2020

(30) Foreign Application Priority Data
Mar. 2, 2018 (JP) .............................. JP2018-037817

(51) Int. Cl.
*H01L 45/00* (2006.01)
*G11C 13/00* (2006.01)
(Continued)

(52) U.S. Cl.
CPC ........ *H01L 45/143* (2013.01); *G11C 13/0004* (2013.01); *H01L 45/085* (2013.01);
(Continued)

(58) Field of Classification Search
CPC ... H01L 45/143; H01L 45/085; H01L 27/224; H01L 27/2427; H01L 27/2463;
(Continued)

(56) References Cited

U.S. PATENT DOCUMENTS 10,163,977 B1 * 12/2018 Fantini .................... H01L 45/04
2007/0247899 A1   10/2007 Gordon et al.
(Continued)

FOREIGN PATENT DOCUMENTS

DE    60315337 T2    5/2008
JP    2006-086526    3/2006
(Continued)

OTHER PUBLICATIONS

International Search Report and Written Opinion prepared by the Japanese Patent Office dated Apr. 3, 2019, for International Application No. PCT/JP2019/003426.
(Continued)

*Primary Examiner* — Jerome Leboeuf
(74) *Attorney, Agent, or Firm* — Sheridan Ross P.C.

(57) ABSTRACT

A switch device according to an embodiment of the present disclosure includes a first electrode; a second electrode opposed to the first electrode; and a switch layer including selenium (Se), at least one kind of germanium (Ge) or silicon (Si), boron (B), carbon (C), (Ga), and arsenic (As), and provided between the first electrode and the second electrode.

12 Claims, 12 Drawing Sheets

(51) Int. Cl.
  *H01L 27/22* (2006.01)
  *H01L 27/24* (2006.01)
(52) U.S. Cl.
  CPC ...... *G11C 13/0069* (2013.01); *G11C 2213/70* (2013.01); *H01L 27/224* (2013.01); *H01L 27/249* (2013.01); *H01L 27/2427* (2013.01); *H01L 27/2463* (2013.01); *H01L 45/145* (2013.01)
(58) Field of Classification Search
  CPC ..... H01L 27/249; H01L 45/145; H01L 45/06; H01L 27/22; H01L 27/24; H01L 45/149; G11C 13/0004; G11C 13/0069; G11C 2213/70; G11C 11/1659; G11C 13/0007; G11C 2213/52; G11C 2213/71; G11C 2213/76; G11C 13/003; G11C 2213/15
  See application file for complete search history.

(56) References Cited

U.S. PATENT DOCUMENTS

| | | | |
|---|---|---|---|
| 2008/0273379 | A1 | 11/2008 | Gordon et al. |
| 2009/0021977 | A1* | 1/2009 | Kang .................. H01L 45/144 257/E47.001 |
| 2012/0176831 | A1* | 7/2012 | Xiao .................. G11C 13/0023 257/4 |
| 2013/0344676 | A1 | 12/2013 | Chang |
| 2016/0336378 | A1 | 11/2016 | Ohba et al. |
| 2017/0244026 | A1 | 8/2017 | Wu et al. |
| 2017/0309683 | A1* | 10/2017 | Sim ........................ H01L 45/06 |

FOREIGN PATENT DOCUMENTS

| | | |
|---|---|---|
| JP | 2009-534835 | 9/2009 |
| JP | 2010-157316 | 7/2010 |
| WO | WO 2015/107945 | 7/2015 |

OTHER PUBLICATIONS

Huang et al., "One Selector-One Resistor (1S1R) Crossbar Array for High-density Flexible Memory Applications," 2011 IEEE International Electron Devices Meeting, Washington, D.C., Dec. 5-7, 2011, 4 pages.

Lee et al., "Highly-Scalable Threshold Switching Select Device based on Chaclogenide Glasses for 3D Nanoscaled Memory Array," 2012 IEEE International Electron Devices Meeting, Dec. 10-13, 2012, 3 pages.

Lee et al., "Varistor-type bidirectional switch (JMAX>107A/cm2, selectivity~104) for 3D bipolar resistive memory arrays," 2012 IEEE Symposium on VLSI Technology, Jun. 12-14, 2012, 2 pages.

* cited by examiner

SWITCH DEVICE, STORAGE APPARATUS, AND MEMORY SYSTEM INCORPORATING BORON AND CARBON

CROSS REFERENCE TO RELATED APPLICATIONS

This application is a national stage application under 35 U.S.C. 371 and claims the benefit of PCT Application No. PCT/JP2019/0003426 having an international filing date of 31 Jan. 2019, which designated the United States, which PCT application claimed the benefit of Japanese Patent Application No. 2018-037817 filed 2 Mar. 2018, the entire disclosures of each of which are incorporated herein by reference.

TECHNICAL FIELD

The present disclosure relates to a switch device including a chalcogenide layer between electrodes, and to a storage apparatus and a memory system that each include the switch device.

BACKGROUND ART

In recent years, an increase in capacity is demanded for data storage non-volatile memories represented by resistance change memories such as a ReRAM (resistance random access memory) and a PRAM (Phase-Change Random Access Memory) (registered trademark). In existing resistance change memories each using an access transistor, however, a floor area per unit cell is large. Therefore, the increase in capacity is not easy even if miniaturization is performed under the same design rule, as compared with, for example, flash memories such as an NAND flash memory. In contrast, in a case of using a so-called cross point array structure in which a memory device is disposed at an intersection point (a cross point) of wiring lines intersecting with each other, the floor area per unit cell is decreased, which makes it possible to achieve the increase in capacity.

A selection device (a switch device) for cell selection is provided in addition to the memory device in a cross point memory cell. Examples of the switch device include a switch device that is configured using, for example, a PN diode, an avalanche diode, or a metal oxide (for example, refer to NPTLs 1 and 2). In addition, the examples of the switch device further include a switch device (an ovonic threshold switch (OTS) device) using, for example, a chalcogenide material (for example, refer to PTLs 1 and 2, and NPTL 3).

CITATION LIST

Patent Literature

PTL 1: Japanese Unexamined Patent Application Publication No. 2006-86526
PTL 2: Japanese Unexamined Patent Application Publication No. 2010-157316

Non-Patent Literature

NPTL 1: Jiun-Jia Huang et al., 2011 IEEE IEDM11-733 to 736
NPTL 2: Wootae Lee et al., 2012 IEEE VLSI Technology symposium pp. 37 to 38
NPTL 3: Myoung-Jae Lee et al., 2012 IEEE IEDM 2.6.1 to 2.6.4

SUMMARY OF THE INVENTION

Incidentally, a switch device using selenium (Se) is desired to achieve an improvement in heat resistance while having an advantage of a low leakage current as compared with a case where a switch device uses any other chalcogen element such as Te.

It is desirable to provide a switch device that makes it possible to improve heat resistance, and a storage apparatus and a memory system that each include the switch device.

A switch device according to an embodiment of the present disclosure includes: a first electrode; a second electrode opposed to the first electrode; and a switch layer including selenium (Se), at least one kind of germanium (Ge) or silicon (Si), boron (B), carbon (C), gallium (Ga), and arsenic (As), and provided between the first electrode and the second electrode.

A storage apparatus according to an embodiment of the present disclosure includes a plurality of memory cells, and each of the memory cells includes a memory device and the switch device according to the embodiment of the present disclosure described above directly coupled to the memory device.

A memory system according to an embodiment of the present disclosure includes: a host computer including a processor; a memory including a memory cell array that includes a plurality of memory cells, and a memory controller that performs control of a request to the memory in accordance with a command from the host computer, and each of the plurality of memory cells includes a memory device and the switch device according to the embodiment of the present disclosure described above directly coupled to the memory device.

In the switch device according to the embodiment of the present disclosure, the storage apparatus according to the embodiment of the present disclosure, and the memory system according to the embodiment of the present disclosure, the switch layer includes selenium (Se), at least one kind of germanium (Ge) or silicon (Si), boron (B), carbon (C), gallium (Ga), and arsenic (As). This makes it possible to reduce alteration of the switch layer caused by a heat load in a manufacturing process.

According to the switch device according to the embodiment of the present disclosure, the storage apparatus according to the embodiment of the present disclosure, and the memory system according to the embodiment of the present disclosure, the switch layer is formed using selenium (Se), at least one kind of germanium (Ge) or silicon (Si), boron (B), carbon (C), gallium (Ga), and arsenic (As), which reduces alteration of the switch layer caused by the heat load in the manufacturing process. This makes it possible to improve heat resistance of the switch device using selenium (Se).

It is to be noted that effects described here are not necessarily limited and may include any of effects described in the present disclosure.

MODES FOR CARRYING OUT THE INVENTION

In the following, some embodiments of the present disclosure are described in detail with reference to the drawings. The following description is given of specific examples of the present disclosure, and the present disclosure is not limited to the following embodiments. Moreover, the present disclosure is not limited to positions, dimensions, dimension ratios, etc. of respective components illustrated in the respective drawings. It is to be noted that description is given in the following order.
1. Embodiment
(An example in which a switch layer includes selenium (Se), at least one kind of germanium (Ge) or silicon (Si), boron (B), carbon (C), gallium (Ga), and arsenic (As))
   1-1. Configuration of Switch Device
   1-2. Configuration of Memory Cell Array
   1-3. Workings and Effects 2. Modification Examples
   2-1. Modification Example 1 (Another example of a memory cell array having a planar configuration)
   2-2. Modification Example 2 (An example of a memory cell array having a three-dimensional configuration)
3. Application Example (Data storage system)
4. Examples

1. First Embodiment

1-1. Configuration of Switch Device

Figure 1:
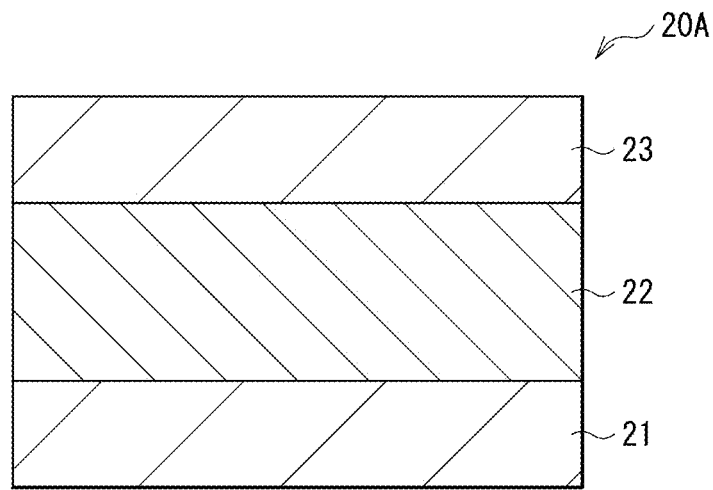
FIG. 1 is a cross-sectional view of an example of a configuration of a switch device according to an embodiment of the present disclosure.
Figure 5:
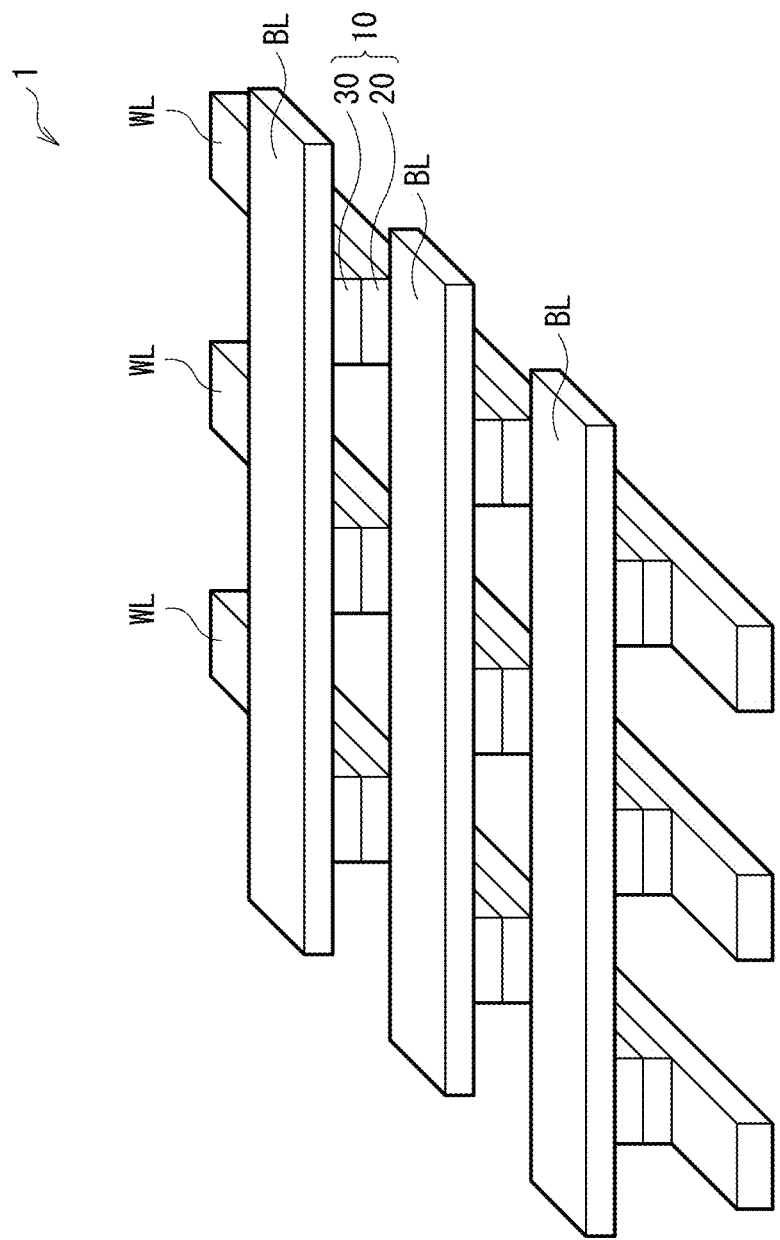
FIG. 5 illustrates an example of a schematic configuration of a memory cell array according to the embodiment of the present disclosure.

FIG. 1 illustrates an example of a cross-sectional configuration of a switch device (a switch device 20A) according to an embodiment of the present disclosure. The switch device 20A selectively operates any of a plurality of storage devices (memory devices 30; FIG. 5) arranged in a memory cell array 1 having a so-called cross point array structure illustrated in FIG. 5, for example. The switch device 20A (a switch device 20; FIG. 5) is coupled in series to the memory device 30 (specifically, a memory layer 31), and includes a lower electrode 21 (a first elect a switch layer 22, and an upper electrode 23 (a second electrode) in this order.

The lower electrode 21 includes a wiring material used for a semiconductor process. Examples of the wiring material include tungsten (W), tungsten nitride (WN), titanium nitride (TiN), copper (Cu), aluminum (Al), molybdenum (Mo), tantalum (Ta), tantalum nitride (TaN), silicide, and the like. In a case where the lower electrode 21 includes a material, such as Cu, that may possibly cause ion conduction in an electric field, a surface of the lower electrode 21 including Cu or the like may be covered with a material, such as W, WN, titanium nitride (TiN), and TaN, that is less likely to cause ion conduction and heat diffusion.

The switch layer 22 is changed to a low-resistance state by an increase in an application voltage to a predetermined threshold voltage (a switching threshold voltage) or higher, and is changed to a high-resistance state by a decrease in the application voltage to a voltage that is lower than the above-described threshold voltage (the switching threshold voltage). That is, the switch layer 22 has negative differential resistance characteristics, and in a case where a voltage to be applied to the switch device 204 exceeds the predetermined threshold voltage (the switching threshold voltage), the switch layer 22 allows a current increased by several orders of magnitude to flow. Moreover, in the switch layer 22, an amorphous structure of the switch layer 22 is stably maintained irrespective of application of a voltage pulse or a current pulse from an unillustrated power source circuit (a pulse applicator) through the lower electrode 21 and the upper electrode 23. It is to be noted that the switch layer 22 does not perform memory operation such as retention of a conduction path formed by ion movement in response to voltage application even after the application voltage is removed.

The switch layer 22 in the present embodiment specifically includes selenium (Se) among elements of Group 16 in the periodic table. In a switch device 20 having an OTS (Ovonic Threshold Switch) phenomenon, it is necessary for the switch layer 22 to stably maintain an amorphous structure even in a case where a voltage bias for switching is applied. It is possible to generate the OTS phenomenon more stably as the amorphous structure becomes more stable. The switch layer 22 includes boron (B) and carbon (C) in addition to selenium (Se). In addition, the switch layer 22 further includes at least one kind of silicon (Si) or germanium (Ge). Silicon (Si) and germanium (Ge) are elements of Group 14 in the periodic table that are in the same group as carbon (C). The switch layer further includes gallium (Ga). Gallium (Ge) is an element of Group 13 in the periodic table that is in the same group as boron (B). The switch layer further includes arsenic (As).

In a case where an element having a relatively small atomic radius is added to an element having a relatively large atomic radius, a difference between the atomic radii of the constituent elements becomes large, and a crystal structure is not easily formed accordingly, which makes it easier to stabilize the amorphous structure. Accordingly, in a case where an element having a relatively small atomic radius such as boron (B) is added into a layer including selenium (Se) having a relatively large atomic radius as with the switch layer 22, a plurality of elements having different atomic radii are included in the layer, which stabilizes the amorphous structure.

Boron (B) has low electroconductivity among semimetals even being used alone in particular. Accordingly, including boron (B) in the switch layer 22 results in an increase in a resistance value of the switch layer 22. In addition, a simple substance of boron (B) has a high melting point, and a compound of boron (B) also has a high melting point. Accordingly, adding boron (B) results in an improvement in heat resistance of the switch layer 22, Further, boron (B) has a small atomic radius as compared with selenium (Se). Accordingly, a plurality of elements having different atomic radii is included in the amorphous structure, which stabilizes the amorphous structure of the switch layer 22 and stably develops the OTS phenomenon.

Carbon (C) makes it possible to increase resistance of the switch layer 22 in a structure other than a structure having an sp2 orbital that is observed in graphite, and the like. In addition, a simple substance of carbon (C) has a high melting point as with boron (B), and a compound of carbon (C) also has a high melting point. Accordingly, adding carbon (C) results in an improvement in heat resistance of the switch layer 22. Further, carbon (C) has a small ionic radius as compared with selenium (Se). Accordingly, a plurality of elements having different atomic radii is included in the amorphous structure, which stabilizes the amorphous structure of the switch layer 22 and stably develops the OTS phenomenon.

Arsenic (As) forms a strong bond with selenium (Se), and forms, for example, a stable compound such as $As_2Se_3$. Arsenic (As) is easily bonded to selenium (Se) and gallium (Ga), and selenium (Se), gallium (Ga), and arsenic (As) are bonded to each other, thereby easily taking an amorphous structure.

Germanium (Ge) forms a stable amorphous structure in a ternary system including selenium (Se) and arsenic (As) together. Silicon (Si) is an element in the same group as germanium (Ge), and is considered to have effects similar to those of germanium (Ge). Configuring the switch layer 22 using one or both of germanium (Ge) and silicon (Si) together with selenium (Se) and arsenic (As) improves heat resistance of the switch layer 22 and makes it possible to achieve stable switch operation.

Gallium (Ga) easily forms a bond with selenium (Se) and arsenic (As) as described above, and forms, for example, a stable compound such as $Ga_2Se_3$ and GaAs. In addition, gallium (Ga) is strongly bonded to selenium (Se) and arsenic (As) as described above, which stabilizes the amorphous structure. This makes it possible to achieve an amorphous structure that is resistant to structure change and atomic variation even in a case where an electric field associated with the switch operation is applied to the switch layer 22. This makes it possible to suppress a drift (Drift) that is temporal change in the switching threshold voltage and a decrease in threshold voltage caused by deterioration after repetitive operation.

The switch layer 22 preferably includes selenium (Se), boron (B), carbon (C), gallium (Ga), arsenic (As), and at least one kind of silicon (Si) or germanium (Ge) in the following ranges with respect to all elements included in the switch layer First, in a case where the switch layer 22 includes carbon (C), boron (B), and germanium (Ge) or silicon (Si) or both germanium (Ge) and silicon (Si), boron (B), carbon (C), silicon (Si), and germanium (Ge) are preferably included in a total composition range ((C+B)+{Ge, Si, (Ge+Si)}) from 15 at % to 35 at % both inclusive, a range from 5 at % to 20 at % both inclusive of a total (C+B) of carbon (C) and boron (B), a range from 5 at % to 20 at % both inclusive of a total (Ge, Si, (Ge+Si)) of germanium (Ge) or silicon (Si) or both germanium (Ge) and silicon (Si), and a range from 0 to 0.2 both inclusive of a ratio (C/(C+B)) of carbon (C) to the total of carbon (C) and boron (B). For example, gallium (Ga) is preferably included in a range from 2 at % to 10 at % both inclusive. For example, arsenic (As) and selenium (Se) are preferably included in a range from 60 at % to 80 at % both inclusive of a total (As+Se) of arsenic (As) and selenium (Se), a range from 20 at % to 40 at % both inclusive of arsenic (As), and a range from 30 at % to 50 at % both inclusive of selenium (Se), The switch layer 22 may further include nitrogen (N) in addition to the elements described above. A content of nitrogen (N) included in the switch layer 22 is preferably in a range of 30 at % or less with respect to all elements included in the switch layer 22, for example. Nitrogen (N) is an element in the same group as arsenic (As), which forms a strong bond with selenium (Se), as with arsenic (As). Nitrogen (N) is also bonded to boron (B) and germanium (Ge) in amorphous to stabilize the amorphous structure. This suppresses variation in threshold voltage and improves heat resistance of the switch layer 22.

The switch layer 22 is preferably formed including any of elemental compositions of BCGaSiAsSe, BCGaGeAsSe, BCGaSiGeAsSe, BCGaSiAsSeN, BCGaGeAsSeN, and BCGaSiGeAsSeN.

A film thickness in a stacking direction of the switch layer is preferably from 3 nm to 30 nm both inclusive, and more preferably from 10 nm to 20 nm both inclusive. In a case where the film thickness of the switch layer 22 exceeds 30 nm, the threshold voltage may possibly become too high. In a case where the film thickness of the switch layer 22 is less than 3 nm, for example, 1 nm, the threshold voltage may possibly become too low to cause occurrence of leakage and variation in the threshold voltage.

It is possible to use a publicly known semiconductor wiring material for the upper electrode 23 as with the lower electrode 21; however, a stable material that does not react with the switch layer 22 even through post-annealing is preferable. In addition, the lower electrode 21 and the upper electrode 23 include the same material and have the same configuration, which makes it possible to achieve switch operation symmetric at a positive voltage and a negative voltage.

It is to be noted that a layer consisting of carbon (C) or a layer including carbon (C) may be provided each between the upper electrode 23 and the switch layer 22 and between the switch layer 22 and the upper electrode 23. Providing the layer consisting of carbon (C) or the layer including carbon (C) makes it possible to suppress diffusion of a metal element to a chalcogen element and prevent deterioration in characteristics.

The switch device 20A according to the present embodiment has switch characteristics in which a resistance value thereof is high (a high-resistance state (an OFF state)) in an initial state, and becomes low (a low-resistance state (an ON state)) at a certain voltage (the switching threshold voltage) or higher upon voltage application. In addition, the switch device 20A maintains a high resistance value in a case where the application voltage is lower than the switching threshold voltage. That is, the switch device 20A does not perform memory operation caused by occurrence of phase change (between an amorphous phase and a crystal phase) in the switch layer 22 in response to application of a voltage pulse or a current pulse from an unillustrated power source circuit (a pulse applicator) through the lower electrode 21 and the upper electrode 23.

The switch device 20 according to the present embodiment may have the following configuration other than the configuration of the switch device 20A described above.

Figure 2:
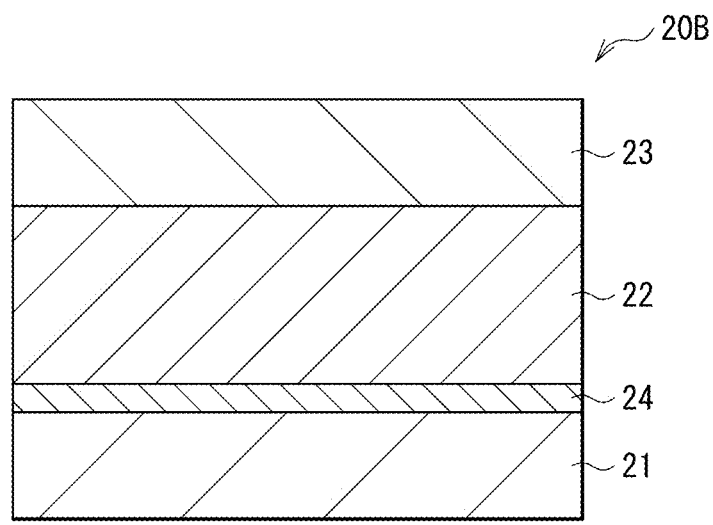
FIG. 2 is a cross-sectional view of another example of the configuration of the switch device according to the embodiment of the present disclosure.

A switch device 20B illustrated in FIG. 2 includes a high resistance layer 24 between the lower electrode 21 and the switch layer 22. The high-resistance layer 24 has, for example, a higher insulation property than the switch layer 22, and includes, for example, an oxide of a metal element or a non-metal element, a nitride of a metal element or a non-metal element, or a mixture thereof. It is to be noted that FIG. 2 illustrates an example in which the high-resistance layer 24 is provided on side of the lower electrode 21, but the high-resistance layer 24 is not limited thereto, and may be provided on side of the upper electrode 23. In addition, the high-resistance layers 24 may be provided on both the side of the lower electrode 21 and the side of the upper electrode 23 with the switch layer 22 interposed therebetween. Further, a multilayer configuration in which a plurality of switch layers 22 and a plurality of high-resistance layers 24 are stacked may be adopted.

Figure 3:
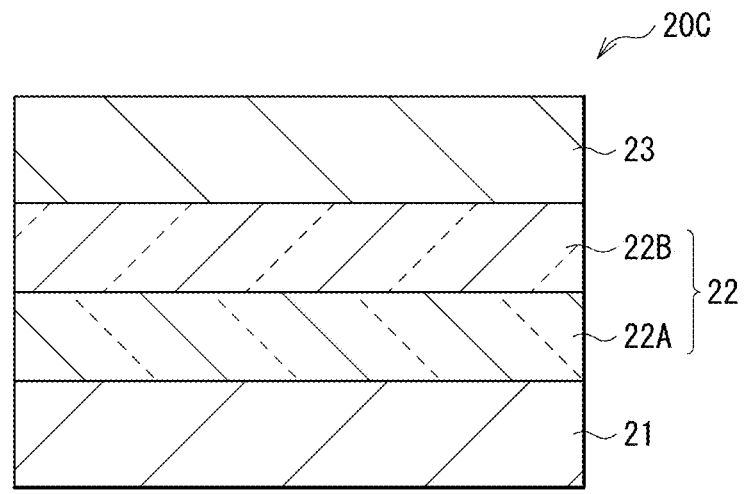
FIG. 3 is a cross-sectional view of another example of the switch device according to the embodiment of the present disclosure.

In a switch device 20C illustrated in FIG. 3, the switch layer 22 includes the elements described above, and is formed as a stacking structure of a first layer and a second layer 22B having compositions different from each other. It is to be noted that in FIG. 3, a two-layer configuration is adopted; however, three or more layers may be stacked.

Figure 4:
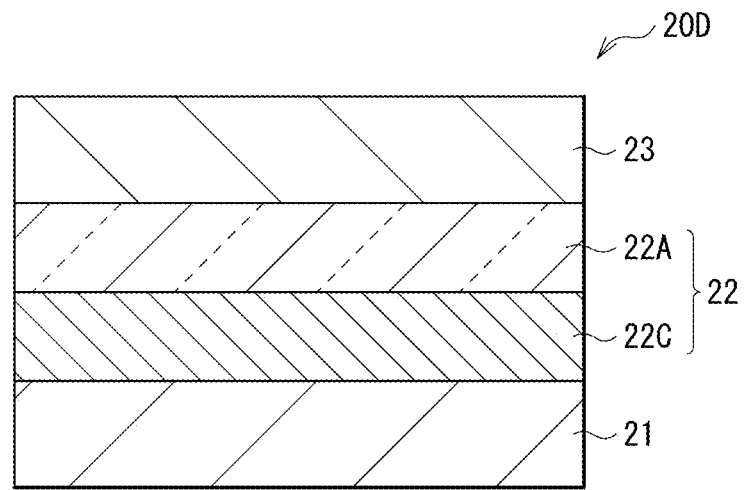
FIG. 4 is a cross-sectional view of another example of the configuration of the switch device according to the embodiment of the present disclosure.

In a switch device 20D illustrated in FIG. 4, the switch layer 22 is formed as a stacking structure of the first layer 22A including the elements described above and a third layer 22C also including an element other than the elements described above. It is to be noted that the stacking order of the first layer 22A and the third layer 22C is not particularly limited, and the third layer 22C may be provided on side of the upper electrode 23. In addition, the third layer 22C may include a plurality of layers that includes an element other than the elements described above and has compositions different from each other. The first layer 22A may also include a plurality of layers that includes the elements described above and has compositions different from each other. Moreover, in a case where the first layer 22A and the third layer 22C each include a plurality of layers, the layers of the first layer A and the layers of the third layer 22C may be alternately stacked.

1-2. Configuration of Memory Cell Array

FIG. 5 illustrates an example of a configuration of the memory cell array 1 in perspective view. The memory cell array 1 corresponds to a specific example of a "storage apparatus" of the present disclosure. The memory cell array 1 has a cross-point array structure, and includes memory cells 10 each of which is provided at a position (a cross point) where each of word lines WL and each of bit lines BL are opposed to each other, as illustrated in FIG. 5, for example. That is, the memory cell array 1 includes a plurality of word lines WL, a plurality of bit lines BL, and a plurality of memory cells 10 that are disposed at respective cross points one by one. As described above, it is possible for the memory cell array 1 according to the present embodiment to have a configuration in which the plurality of memory cells 10 is disposed in a plane (two-dimensionally, in an XY plane direction).

Figure 10:
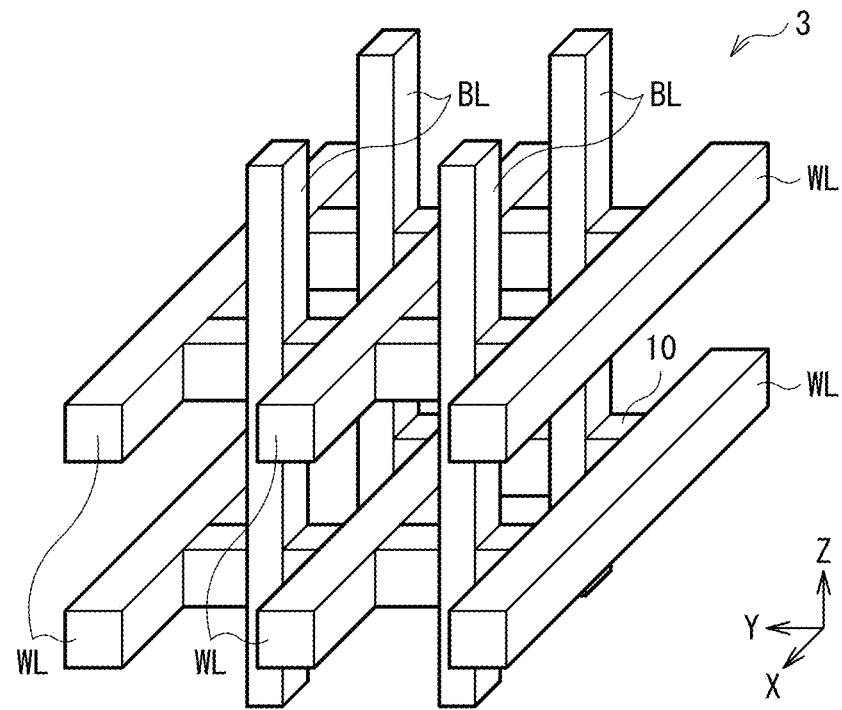
FIG. 10 illustrates an example of a schematic configuration of a memory cell array according to a modification example 2 of the present disclosure.

The respective word lines WL extend in directions that are common to each other. The respective bit lines BL extend in directions that are different from the extending directions of the word lines WL (for example, in a direction orthogonal to the extending directions of the word lines WL) and are common to each other. It is to be noted that the plurality of word lines WL is disposed in one or a plurality of layers. For example, the plurality of word lines WL may be disposed separately in a plurality of levels, as illustrated in FIG. 10. The plurality of bit lines BL is disposed in one or a plurality of layers. For example, the plurality of hit lines BL may be disposed separately in a plurality of levels, as illustrated in FIG. 10.

The memory cell array 1 includes the plurality of memory cells 10 that are two-dimensionally arranged on a substrate. The substrate includes, for example, a wiring group that is electrically coupled to each of the word lines WL and each of the bit lines BL, a circuit that couples the wiring group to an external circuit, and the like. Each of the memory cells 10 includes a memory device 30 and the switch device 20 that is directly coupled to the memory device 30. Specifically, each of the memory cells 10 has a configuration in which the memory layer 31 included in the memory device 30 and the switch layer 22 included in the switch device 20 are stacked with an intermediate electrode 41 interposed therebetween. The switch device 20 corresponds to a specific example of a "switch device" of the present disclosure. The memory device 30 corresponds to a specific example of a "memory device" of the present disclosure.

The memory device 30 is disposed, for example, close to the bit line BL, and the switch device 20 is disposed, for example, close to the word line WL. It is to be noted that the memory device 30 may be disposed close to the word line WL, and the switch device 20 may be disposed close to the bit line BL. In addition, in a case where the memory device 30 is disposed close to the bit line BL and the switch device 20 is disposed close to the word line WBL in a certain layer, the memory device 30 may be disposed close to the word line WL and the switch device 20 may be disposed close to the bit line BL in a layer adjacent to the certain layer. Moreover, in each layer, the memory device 30 may be formed above the switch device 20, or inversely, the switch device 20 may be formed above the memory device 30.

Memory Device

Figure 6:
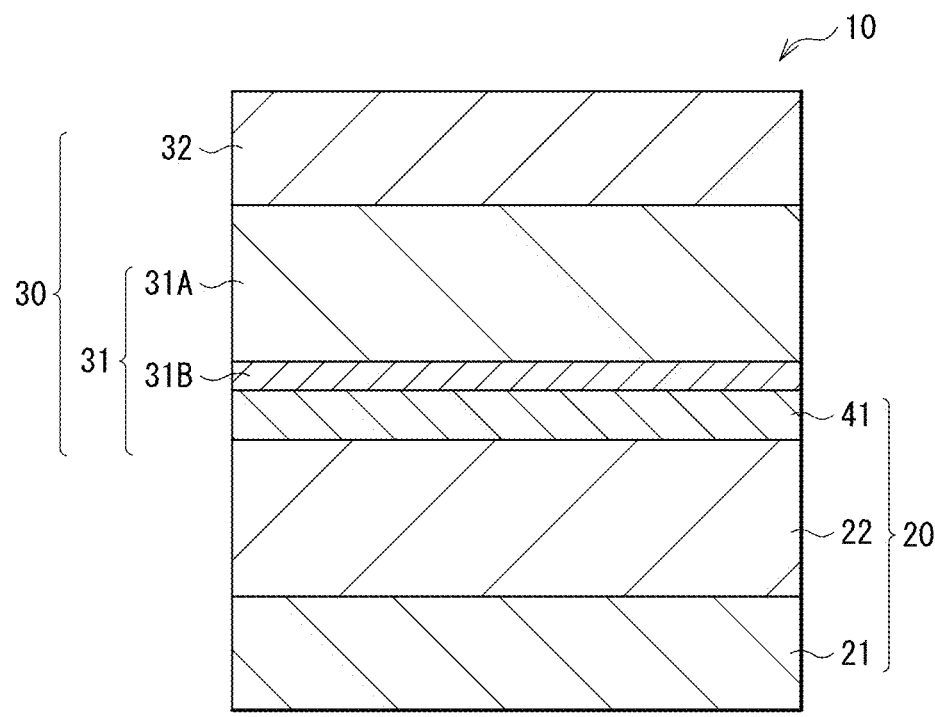
FIG. 6 is a cross-sectional view of an example of a configuration of a memory cell illustrated in FIG. 5.

FIG. 6 illustrates an example of a cross-sectional configuration of the memory cell 10 in the memory cell array 1. The memory device 30 includes a lower electrode, an upper electrode 32 that is opposed to the lower electrode, and the memory layer 31 provided between the lower electrode and the upper electrode 32. The memory layer 31 has a stacking structure in which a resistance change layer 31B and an ion source layer 31A are stacked from side of the lower electrode. It is to be noted that in the present embodiment, the intermediate electrode 41 provided between the memory layer 31 included in the memory device 30 and the switch layer 22 included in the switch device 20 also serves as the lower electrode of the memory device 30 described above.

The ion source layer 31A includes movable elements that form a conduction path in the resistance change layer 31B in response to application of an electric field. Examples of the movable elements include transition metal elements, aluminum (Al), copper (Cu), and chalcogen elements. Examples of the chalcogen elements include tellurium (Te), selenium (Se), and sulfur (S). Examples of the transition metal elements include elements of Groups 4 to 6 in the periodic table such as titanium (Ti), zirconium (Zr), hafnium (Hf), vanadium (V), niobium (Nb), tantalum (Ta), chromium (Cr), molybdenum (Mo), and tungsten (W). The ion source layer 31A includes one or two or more kinds of the movable elements described above. In addition, the ion source layer 31A may include oxygen (O), nitrogen (N), elements (such as manganese (Mn), cobalt (Co), iron (Fe), nickel (Ni), and platinum (Pt)) other than the movable elements described above, silicon (Si), or the like.

The resistance change layer 31B includes, for example, an oxide of a metal element or a non-metal element, or a nitride of a metal element or a non-metal element. In a case where a predetermined voltage is applied between the intermediate electrode 41 and the upper electrode 32, a resistance value of the resistance change layer 31B is varied. For example, in a case where the voltage is applied between the intermediate electrode 41 and the upper electrode 32, the transition metal elements included in the ion source layer 31A move into the resistance change layer 31B to form the conduction path, which decreases the resistance of the resistance change layer 31B. In addition, a structure defect such as an oxygen defect and a nitrogen defect occurs in the resistance change layer 31B to form the conduction path, which decreases the resistance of the resistance change layer 31B. Further, the conduction path is disconnected or electroconductivity is changed in response to application of a voltage in a direction opposite to the direction of the voltage that is applied in a case where the resistance of the resistance change layer is decreased, which increases the resistance of the resistance change layer.

It is to be noted that the metal element and the non-metal element included in the resistance change layer 31B are not all necessarily in an oxide state, and may be partially oxidized. In addition, it is sufficient for an initial resistance value of the resistance change layer 31B to achieve a device resistance of, for example, about several MΩ to about several hundred GΩ, and a film thickness of the resistance change layer 31B may be preferably, for example, from about 1 nm to about 10 nm, though an optimal value thereof is varied depending on the size of the device and the resistance value of the ion source layer.

Switch Device

The switch device 20 includes, for example, the switch layer 22 between the lower electrode 21 and an upper electrode, and has any of the configurations of the above-described switch devices 20A, 20B, 20C, and 20D illustrated in FIGS. 1 to 4 described above. In the present embodiment, the intermediate electrode 41 provided between the memory layer 31 included in the memory device 30 and the switch layer 22 included in the switch device 20 also serves as the upper electrode described above. Moreover, the lower electrode 21 may also serve as the bit line BL, or may be provided separately from the bit line BL. In a case where the lower electrode 21 is provided separately from the bit line BL, the lower electrode 21 is electrically coupled to the bit line BL. It is to be noted that, in the case where the switch device 20 is provided close to the word line WL, the lower electrode 21 may also serve as the word line WL, or may be provided separately from the word line WL. Here, in a case where the lower electrode 21 is provided separately from the word line WL, the lower electrode 21 is electrically coupled to the word line WL.

The intermediate electrode 41 may also serve as an electrode of the switch device 20 or may be provided separately from the electrode of the switch device 20. The upper electrode 32 of the memory device 30 may also serve as the word line WL or the bit line BL or may be provided separately from the word line WL and the bit line BL. In a case where the upper electrode 32 is provided separately from the word line WL and the bit line BL, the upper electrode 32 is electrically coupled to the word line WL or the bit line BL. The upper electrode 32 includes a wiring material used for a semiconductor process. The upper electrode 32 may include, for example, tungsten (W), tungsten nitride (WN), titanium nitride (TiN), carbon (C), copper (Cu), aluminum (Al), molybdenum (Mo), tantalum (Ta), tantalum nitride (Taws), titanium tungsten (TiW), silicide, or the like.

The intermediate electrode 41 preferably includes, for example, a material that prevents chalcogen elements included in the switch layer 22 and the ion source layer 31A from diffusing in response to application of an electric field. This is because, for example, the ion source layer 31A includes transition metal elements as elements that allow for memory operation and retaining of a writing state, and switch characteristics may possibly be deteriorated in a case where such transition metal elements are diffused into the switch layer 22 in response to the application of the electric field. Accordingly, the intermediate electrode 41 preferably includes a barrier material having a barrier property that prevents diffusion and ion conduction of the transition metal elements. Examples of the barrier material include tungsten (W), tungsten nitride (WN), titanium nitride (TiN), carbon (C), molybdenum (Mo), tantalum (Ta), tantalum nitride (TaN), titanium tungsten (TiW), silicide, and the like.

Moreover, the memory cell 10 may have the following configuration other than the configuration illustrated in FIG. 6.

Figure 7:
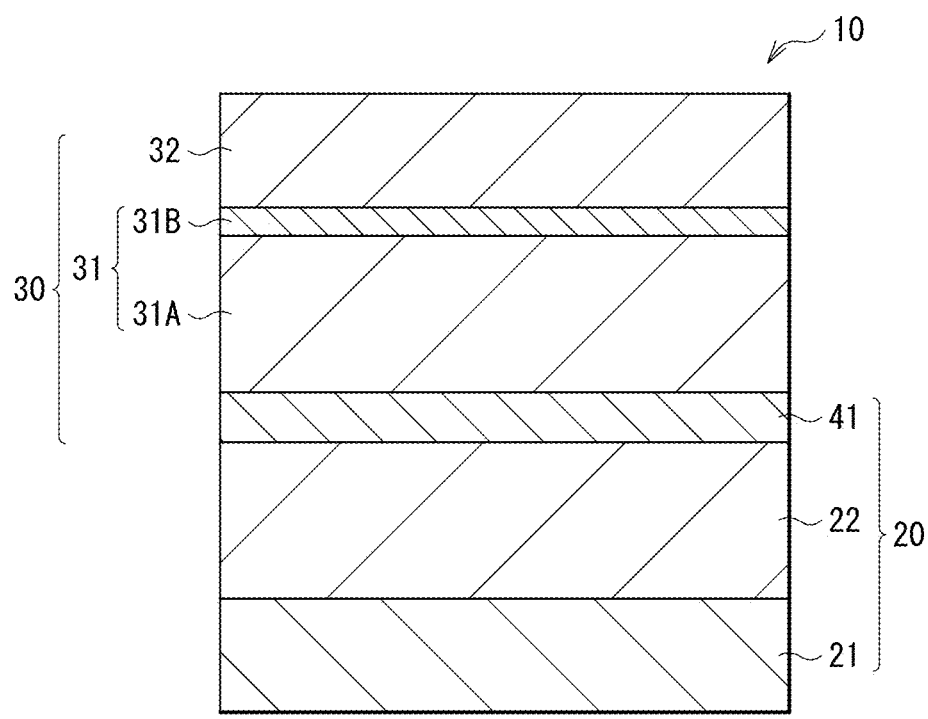
FIG. 7 is a cross-sectional view of another example of the configuration of the memory cell illustrated in FIG. 5.
Figure 8:
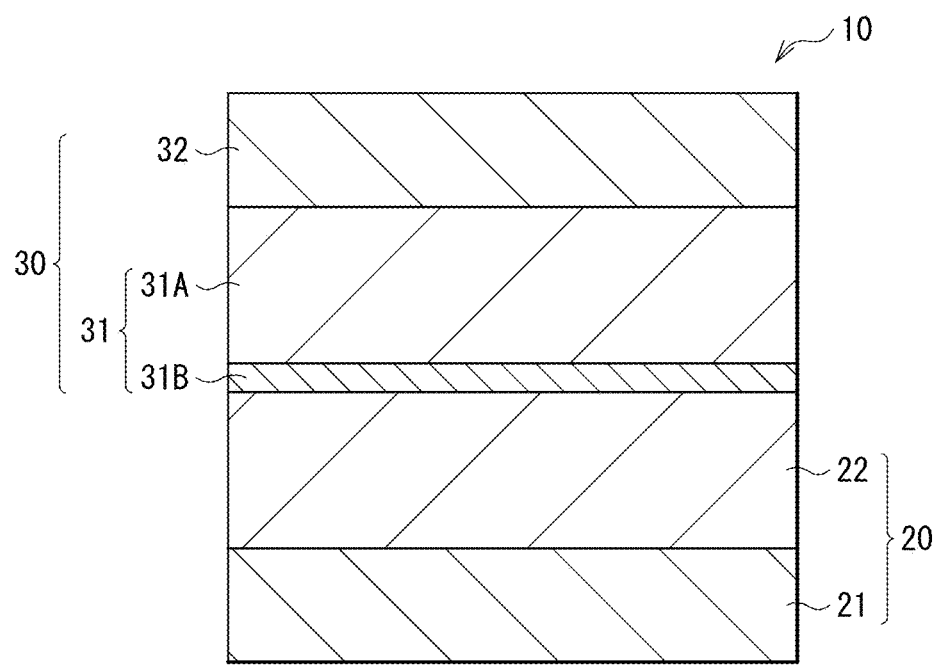
FIG. 8 is a cross-sectional view of another example of the configuration of the memory cell illustrated in FIG. 5.

In the memory cell 10 illustrated in FIG. 7, the memory device 30 has a configuration in which the resistance change layer 31B is provided between the ion source layer 31A and the upper electrode 32. The memory cell 10 illustrated in FIG. 8 has a configuration in which the intermediate electrode 41 is not provided and the switch layer 22 and the ion source layer 31A are stacked with the resistance change layer 31B interposed therebetween. It is to be noted that in the memory cells 10 illustrated in FIGS. 6 to 8, the switch device 20 has the configuration of the switch device 20A illustrated in FIG. 1 as an example; however, the switch device 20 is not limited thereto, and may have any of the configurations of the switch devices 20B, 20C, and 20D illustrated in FIGS. 2 to 4. Moreover, the switch device 20 may have a configuration in which a plurality of layers of the switch device 20 and a plurality of layers of the memory device 30 are stacked alternately, for example.

Moreover, in the memory cell array 1 according to the present embodiment, the memory device 30 may have any memory form such as an OTP (One Time Programmable) memory that uses a fuse and an anti-fuse and is writable only once, a unipolar phase change memory, and a magnetic memory using a magnetoresistive device. Examples of the unipolar phase change memory include a PCRAM,

1-3. Workings and Effects

As described above, in recent years, an increase in capacity is demanded for data storage non-volatile memories, and a memory having a cross point array structure that has a small floor area per unit cell and allows for an increase in capacity has been developed, in the memory having the cross point array structure, a memory cell is disposed at an intersection point of wiring lines intersecting with each other, and the memory cell includes a memory device and a switch device that are coupled in series to each other, The switch device is desired to have characteristics that while a current sufficient to operate the memory device flows through the switch device upon application of a voltage equal to or higher than a certain threshold voltage, only as small a leakage current as possible flows through the switch device upon application of a voltage equal to or lower than the threshold voltage including 0 V.

The switch device is configured using OTS characteristics of a chalcogen element. In a switch device using selenium (Se) as the chalcogen element, it is possible to achieve thickness reduction, as compared with a case where tellurium (Te) is used, and small leakage and superior switch device characteristics are expectable, but selenium (Se) has a melting point of 221° C. that is low, which causes an issue that process temperature resistance is low. Specifically, in the switch device using selenium (Se), alteration or the like occurs in an OTS layer corresponding to the switch layer 22 according to the present embodiment after one hour at 400° C. corresponding to a heat load in a typical semiconductor process, which results in significant deterioration in characteristics as the switch device.

Examples of an elemental composition of the OTS layer using selenium (Se) include GeAsSe and SiGeAsSe, A GeAsSe layer has small leakage and small variation in threshold voltage and exhibits superior characteristics, but alteration is recognized on a surface of the GeAsSe layer after heat treatment for one hour at 400° C. corresponding to the heat load in the typical semiconductor process, which causes the GeAsSe layer not to exhibit switch characteristics. Alternatively, even if the switch characteristics are obtained, operation is unstable and variation in threshold voltage is increased, which causes deterioration in in a drift index, reduction in the number of times of repetitive operation, and the like. Accordingly, characteristics as the switch device significantly deteriorates. A similar tendency is also recognized in SiGeAsSe.

For example, in NPTL 4 (R. P. Wang, A. Smith, A. Prasad, D. Y. Choi, and B. Luther-Davies, Journal of Applied Physics 106, 043520 (2009)), Tg (glass-transition temperature) with respect to various compositions of GeAsSe is illustrated in Table 1 in the literature. As seen from Table 1, while Tg of GeAsSe is 247.9° C. in stoichiometric composition, Tg becomes around 400° C. with a Ge content of about 30 at % and a Se content of about 50 at %. It is presumable that Tg becomes higher with an increase in Ge and a decrease in Se, which makes the amorphous structure stable with respect to the temperature, thereby causing this change. In contrast, an increase in Ge and a decrease in Se exert an adverse influence such as a significant increase in leakage on switch device characteristics.

In contrast, in the switch device 20A according to the present embodiment, the switch layer 22 is configured using selenium (Se), at least one kind of germanium (Ge) or silicon (Si), boron (B), carbon (C), gallium (Ga), and arsenic (As). This makes it possible to reduce alteration of the switch layer 22 after heat treatment for one hour at 400° C. performed during a manufacturing process, for example.

As described above, in the switch device 20A according to the present embodiment, the switch layer is formed using selenium (Se), at least one kind of germanium (Ge) or silicon (Si), boron (B), carbon (C), gallium (Ga), and arsenic (As), which reduces alteration of the switch layer caused by a heat load in the manufacturing process. This makes it possible to improve heat resistance of the switch device using selenium (Se).

Next, description is given of modification examples in the embodiment described above. In the following, components similar to those of the embodiment described above are denoted by same reference numerals, and description thereof is omitted where appropriate.

2. Modification Examples

2-1. Modification Example 1

Figure 9:
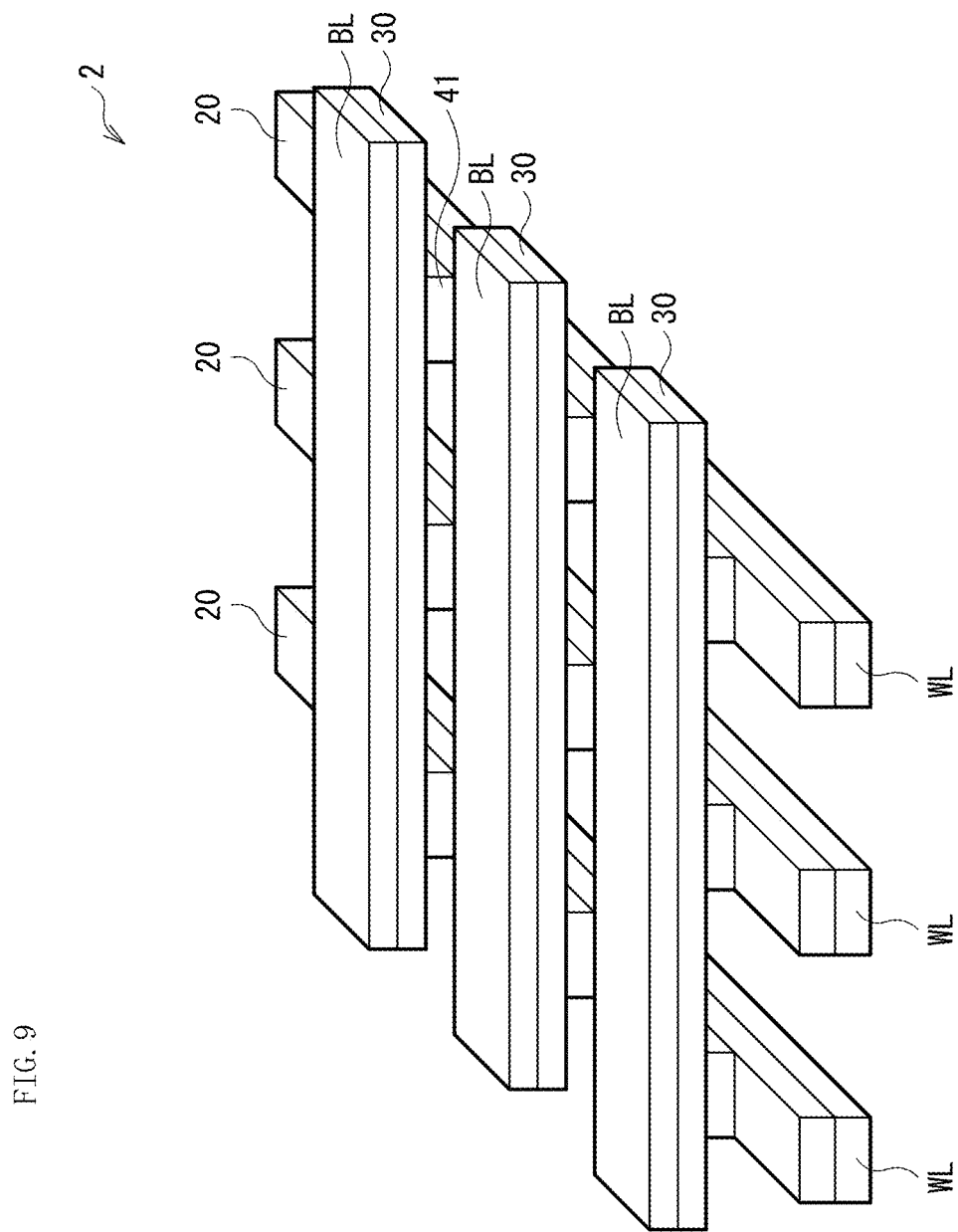
FIG. 9 illustrates a schematic configuration of a memory cell array according to a modification example 1 of the present disclosure.

FIG. 9 illustrates an example of a configuration of a memory cell array 2 according to a modification example of the present disclosure in perspective view. The memory cell array 2 has a so-called cross point array structure, as with the memory cell array 1 described above. In the present modification example, the memory device 30 includes the memory layer 31 extending along each of the bit lines BL that extend in directions common to each other. The switch device 20 includes the switch layer 22 extending along each of the word lines WL that extend in a direction different from the extending directions of the bit lines BL (for example, in a direction orthogonal to the extending directions of the bit lines BL). The switch layer 22 and the memory layer 31 are stacked with the intermediate electrode 41 interposed therebetween at cross points of the plurality of word lines WL and the plurality of bit lines BL.

As described above, the switch devices 20 and the memory devices 30 are not only provided at the cross points, but also respectively extend along the extending directions of the word lines WL and the extending directions of the bit lines BL, which makes it possible to form a switch device layer or a memory device layer simultaneously with a layer that is to serve as the bit lines BL or the word lines WL, and collectively perform shape processing by a photolithography process. Accordingly, it is possible to reduce process steps.

2-2. Modification Example 2

FIGS. 10 to 13 respectively illustrate examples of configurations of memory cell arrays 3 to 6 having a three-dimensional configuration according to a modification example of the present disclosure in perspective view. In the memory cell array having a three-dimensional configuration, the respective word lines WL extend in directions common to each other. The respective bit lines BL extend in directions that are different from the extending directions of the word lines WL (for example, in directions orthogonal to the extending directions of the word lines WL) and common to each other. Moreover, the plurality of word lines WL and the plurality of bit lines BL are disposed in a plurality of respective layers.

In a case where the plurality of word lines WL is disposed separately in a plurality of levels, the plurality of bit lines BL is disposed in a layer between a first layer in which a plurality of word lines WL is disposed and a second layer in which a plurality of word lines WL is disposed. The second layer is adjacent to the first layer. In a case where the plurality of bit lines BL is disposed separately in a plurality of levels, the plurality of word lines WL is disposed in a layer between a third layer in which a plurality of bit lines BL is disposed and a fourth layer in which a plurality of bit lines BL is disposed. The fourth layer is adjacent to the third layer. In a case where the plurality of word lines WL is disposed separately in a plurality of levels and the plurality of bit lines BL is disposed separately in a plurality of levels, the plurality of word lines WL and the plurality of bit lines BL are alternately disposed in a stacking direction of the memory cell array.

Figure 11:
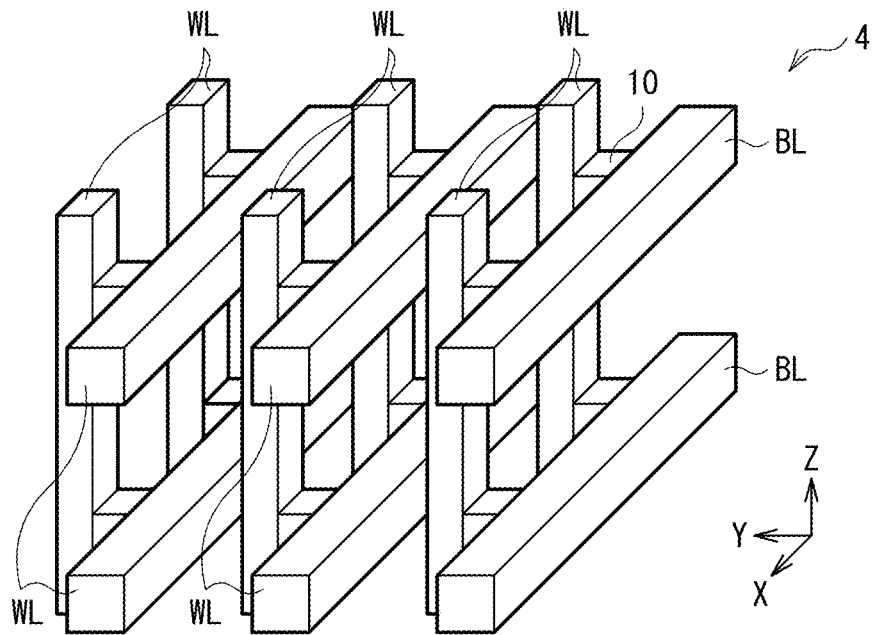
FIG. 11 illustrates another example of the schematic configuration of the memory cell array according to the modification example 2 of the present disclosure.
Figure 12:
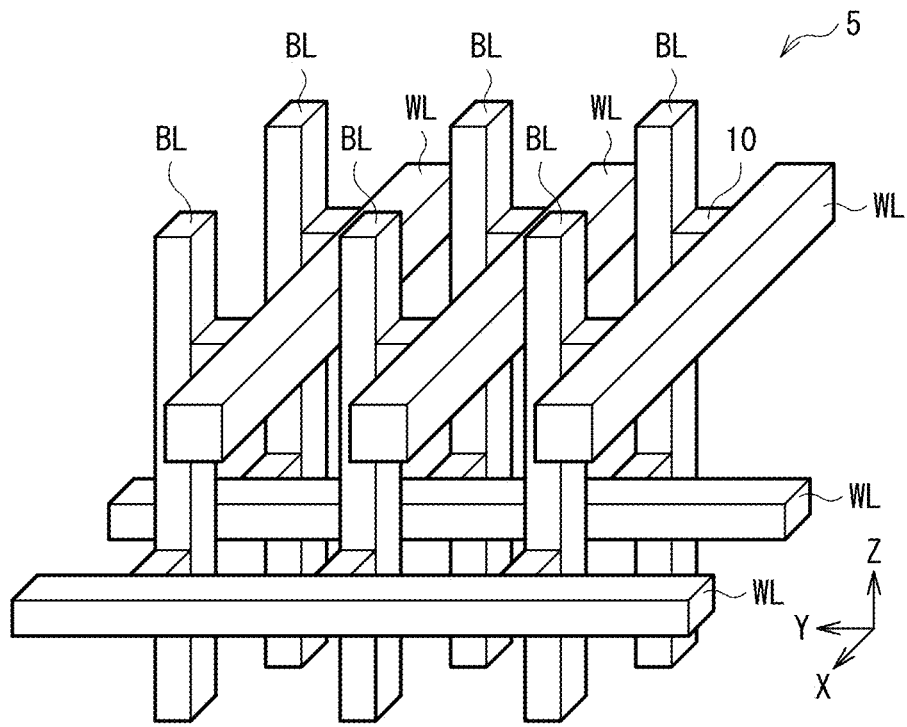
FIG. 12 illustrates another example of the schematic configuration of the memory cell array according to the modification example 2 of the present disclosure.
Figure 13:
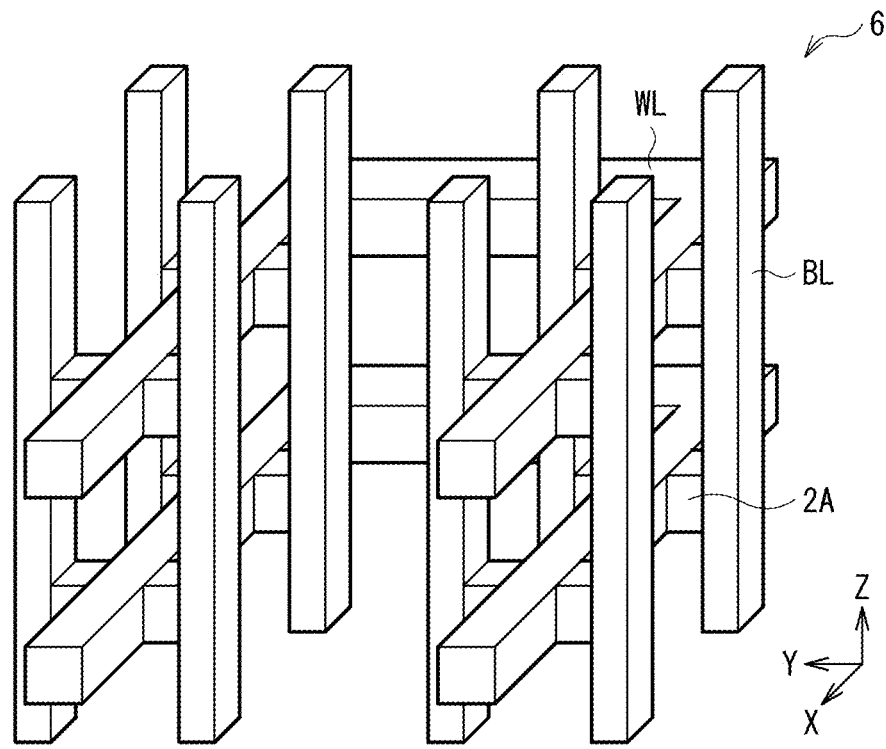
FIG. 13 illustrates another example of the schematic configuration of the memory cell array according to the modification example 2 of the present disclosure.

The memory cell array according to the present modification example has a vertical cross point configuration in which either the word lines WL or the bit lines BL are provided in parallel to a Z-axis direction and the other remaining lines are provided in parallel to an XY-plane direction. For example, as illustrated in FIG. 10, the memory cell array may have a configuration in Which the plurality of word lines WL and the plurality of bit lines BL respectively extend in an X-axis direction and the Z-axis direction and the memory cells 10 are disposed at respective cross points of the word lines WL and the bit lines BL. Moreover, as illustrated in FIG. 11, the memory cell array may have a configuration in which the memory cells 10 are disposed on both sides of each of cross points of the plurality of word lines WL and the plurality of bit lines BL respectively extending in the X-axis direction and the Z-axis direction. Further, as illustrated in FIG. 12, the memory cell array may have a configuration including the plurality of bit lines BL extending in the Z-axis direction, and a plurality of word lines of two kinds extending in two directions, i.e., the X-axis direction or a Y-axis direction. Furthermore, the plurality of word lines WL and the plurality of bit lines BL do not necessarily extend in one direction. For example, as illustrated in FIG. 13, for example, the plurality of bit lines BL ay extend in the Z-axis direction, and the plurality of word lines WL may extend in the X-axis direction, be bent in the Y-axis direction in the middle, and be bent again in the X-axis direction, that is, may extend in a so-called U-letter like shape in the XY plane.

As described above, the memory cell array of the present disclosure has a three-dimensional configuration in which the plurality of memory cells 10 is disposed in a plane (two-dimensionally, in the XY-plane direction) and further stacked in the Z-axis direction, which makes it possible to provide a storage apparatus having higher density and a large capacity.

3. Application Example

Figure 14:
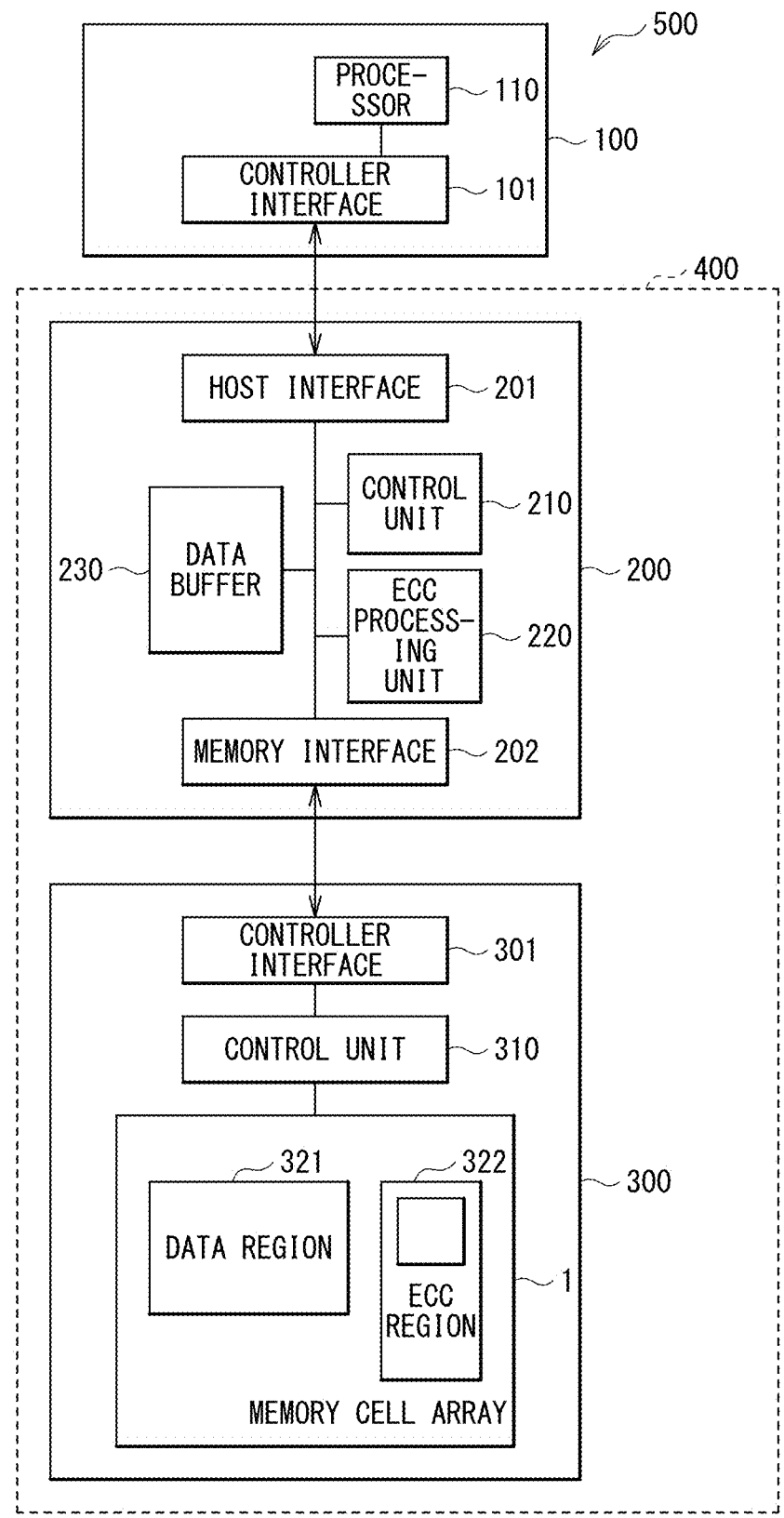
FIG. 14 is a block diagram illustrating a configuration of a data storage system including a memory system of the present disclosure.

FIG. 14 illustrates a configuration of a data storage system (a data storage system 500) including a non-volatile memory system (a memory system 400) that includes the memory cell array 1 (or any of the memory cell arrays 2 to 6) including the memory cells 10 described in the embodiment described above. The data storage system 500 includes a host computer 100, a memory controller 200, and a memory 300. The memory system 400 includes the memory controller 200 and the memory 300.

The host computer 100 issues, to the memory 300, a command for read processing and write processing of data, processing related to error correction, etc. The host computer 100 includes a processor 110 and a controller interface 101. The processor 110 executes processing as the host computer 100, and the controller interface 101 is used for exchange with the memory controller 200.

The memory controller 200 performs control of a request to the memory 300 in accordance with a command from the host computer 100. The memory controller 200 includes a control unit 210, an FCC processing unit 220, a data buffer 230, a host interface 201, and a memory interface 202.

The control unit 210 controls the entire memory controller 200. The control unit 210 interprets the command issued by the host computer 100, and makes a necessary request to the memory 300.

The FCC processing unit 220 executes generation of an error correcting code (ECC) of data stored in the memory 300 and error detection and correction of data read from the memory 300.

The data buffer 230 is a buffer used to temporarily hold write data received from the host computer 100, read data received from the memory 300, etc. in transfer of these data.

The host interface 201 is an interface used for exchange with the host computer 100. The memory interface 202 is an interface used for exchange with the memory 300.

The memory 300 includes a control unit 310, a memory cell array 320, and a controller interface 301. The control unit 310 controls the entire memory 300, and controls access to the memory cell array 320 in accordance with a request received from the memory controller 200. The controller interface 301 is an interface used for exchange with the memory controller 200.

The memory cell array 320 uses the memory cell array 1 (or any of the memory cell arrays 2 to 5) having a cross point array structure including the plurality of word lines WL, the plurality of bit lines BL, and the plurality of memory cells 10 that is disposed at respective cross points one by one. Each of the memory cells 10 includes the switch device 20 (or any of the switch devices 20A, 20B, 20C, and 20D) described in the embodiment described above, and a memory device. The memory device is a resistance change memory (the memory device 30) having a stacking structure of the resistance change layer and the ion source layer, as described above. The ion source layer includes movable elements that form a conduction path in the resistance change layer in response to application of an electric field. In addition, for example, an OTP (One Time Programmable) memory that uses a fuse and an anti-fuse and is writable only once, a unipolar phase change memory PCRAM, or a non-volatile memory (NVM) such as a magnetic memory using a magnetoresistive change device may be used.

Each of the memory cells 10 included in the memory cell array 320 includes a data region 321 and an ECC region 322. The data region 321 is a region for storage of normal data.

As described above, the memory system uses the cross point memory cell array 1 (or any of the memory cell arrays 2 to 5) including the switch device 20 of the present disclosure, which snakes it possible to improve performance such as operation speed.

4. Examples

Specific examples of the present disclosure are described below.

Experiment 1

First, a lower electrode including TiN was cleaned by reverse sputtering. Next, a switch layer including GeAsSe was formed with a film thickness of 15 nm on TiN by reactive sputtering while feeding nitrogen into a film formation chamber, and thereafter C with a film thickness of 15 nm and W with a film thickness of 30 nm were formed to form an upper electrode. Thereafter, patterning and predetermined heat treatment were performed to fabricate a single-transistor-single-switch device. Thereafter, heat treatment for one hour at 400° C. corresponding to a heat load in a typical semiconductor process was performed, and a Drift index and the number of times of repetitive operation were measured as switch device characteristics of the single-transistor-single-switch device. In addition, TiN, GeAsSe (15 nm), C (15 nm), and W (30 nm) were stacked in this order on a substrate as described above, and thereafter surface observation after heat treatment for one hour at 400° C. was performed.

Experimental Examples 1-2 to 1-10

Next, various single-transistor-single-switch devices having a configuration similar to an experimental example 1-1 were fabricated with use of a method similar to that in the experimental example 1 except for the elemental composition of the switch layer (experimental examples 1-2 to 1-10). The elemental compositions of the switch layers in respective experimental examples were GaGeAsSe in the experimental example 1-2. BCGeAsSe in the experimental example 1-3, BCGaAsSe in the experimental example 1-4, GaGeAsSeN in the experimental example 1-5, BCGaGeSeN in the experimental example 1-6, BCGeAsSeN in the experimental example 1-7, BCGaGeAsSe in the experimental example 1-8, BCGaGeAsSeN in the experimental example 1-9, and BCGaSiAsSeN in the experimental example 1-10.

The Drift index and the number of times of repetitive operation measured as the switch device characteristics of the experimental examples 1-1 to 1-10 are described below.

Drift Index

To achieve an increase in capacity of a cross point memory cell array, it is desired to suppress variation in threshold voltage among switch devices caused by temporal change to reduce occurrence of operation error. Temporal change in the threshold voltage is a phenomenon (Drift) in which an operation threshold voltage in a subsequent switch operation is varied as time (interval time) goes on from the last switch operation. In the cross point memory cell array including a plurality of switch devices, interval times of the respective switch devices are generally different; therefore, in a case where an influence of the Drift is large, variation in the operation threshold voltage among the switch devices occurs, which makes favorable operation of the cross point memory cell array difficult. Accordingly, a switch device in which change in the operation threshold voltage is reduced is desired.

The Drift index is a change amount (V) of the operation threshold voltage after a lapse of an interval time of 100 ms from the threshold voltage of the switch device at a time of 0. Specifically, the Drift index is a change amount of the threshold voltage from the time of 0 in a case where a pulse voltage is applied to the switch device to cause the switch device to reliably perform switch operation (at the time of 0), and after a lapse of 100 ms (at the time of 100 ms) as the interval time, the pulse voltage is applied to the switch device again to cause the switch device to perform the switch operation. In the present experiment, the Drift of each of the switch devices was evaluated with use of the Drift index.

Number of Times of Repetitive Operation

In general, deterioration in the switch device characteristics, for example, a decrease in the operation threshold voltage or the like is recognized as the switch device performs repetitive operation. Accordingly, it is desirable not to cause a decrease in operation threshold voltage even if the switch device performs operation a lamer number of times. In the present experiment, the number of times allowing the operation threshold voltage to be kept substantially constant was measured.

Table 1 is a summary of the elemental composition of the switch layer, configuration of the upper electrode, and results of the Drift index, heat resistance, and the number of times of repetitive operation in the experimental examples 1-1 to 1-10. It is to be noted that regarding the heat resistance, A indicates a case where alteration was not recognized on the surface of the switch layer, B indicates a case where alteration was slightly recognized, and C indicates a case where apparent alteration was recognized. In addition, in the experimental example 1-1, heat treatment for two hours at 320° C. was also performed in addition to the heat treatment for one hour at 400° C. corresponding to the heat load in the typical semiconductor process, and current-voltage characteristics after each heat treatment were measured.

TABLE 1

| Experimental Example | Elemental Composition of OTS Layer | Upper Electrode | Heat Resistance Heat Treatment for One Hour at 400° C. | Drift Index (V) | Number of Times of Repetitive Operation (Cycle) |
| --- | --- | --- | --- | --- | --- |
| 1-1 | GeAsSe | C (15 nm)/W (30 nm) | C | — | — |
| 1-2 | GaGeAsSe | C (15 nm)/W (30 nm) | C | — | — |
| 1-3 | BCGeAsSe | C (15 nm)/W (30 nm) | A | 0.33 | >1E6 |
| 1-4 | BCGaAsSeN | C (15 nm)/W (30 nm) | B | 0.19 | <1E3 |
| 1-5 | GaGeAsSeN | C (15 nm)/W (30 nm) | C | — | — |
| 1-6 | BCGaGeSeN | C (15 nm)/W (30 nm) | B | 0.42 | <1E3 |
| 1-7 | BCGeAsSeN | C (15 nm)/W (30 nm) | A | 0.25 | >1E6 |
| 1-8 | BCGaGeAsSe | C (15 nm)/W (30 nm) | A | 0.06 | >1E6 |
| 1-9 | BCGaGeAsSeN | C (15 nm)/W (30 nm) | A | 0.05 | >1E6 |
| 1-10 | BCGaSiAsSeN | C (15 nm)/W (30 nm) | A | 0.08 | >1E6 |

Figure 15:
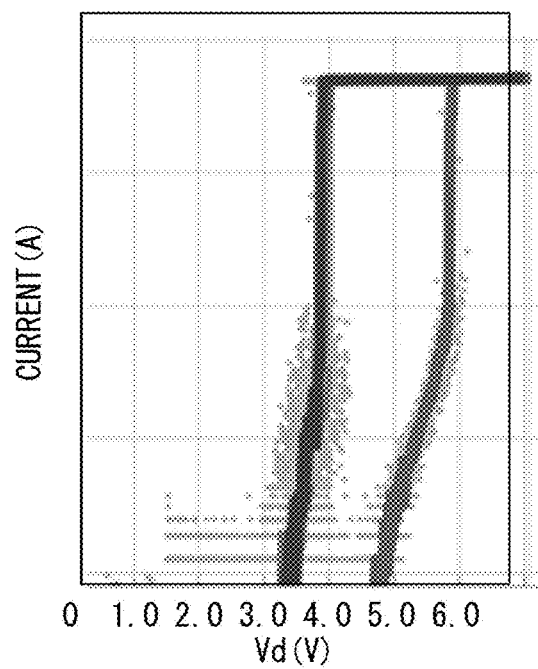
FIG. 15 is an IV characteristic chart after heat treatment for two hours at 320° C. in an experimental example 1-1.
Figure 16:
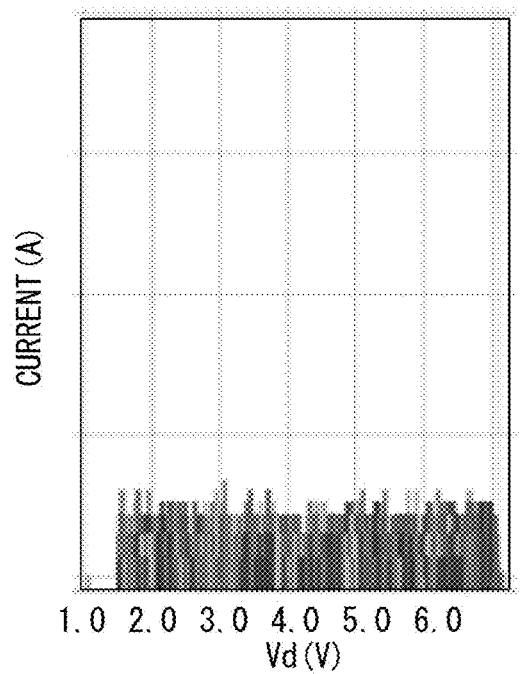
FIG. 16 is an IV characteristic chart after heat treatment for one hour at 400° C. in the experimental example 1-1.

FIG. 15 illustrates an IV curve representing the current-voltage characteristics after the heat treatment for two hours at 320° C. in the experimental example 1-1. FIG. 16 illustrates an IV curve representing the current-voltage characteristics after the heat treatment for one hour at 400° C. in the experimental example 1-1. In the experimental example 1-1 in which the switch layer including GeAsSe was included, favorable switch operation was able to be recognized after the heat treatment for two hours at 320° C., but the switch operation was not able to be recognized after the heat treatment for one hour at 400° C. In addition, in a case where a state of a film surface of the switch layer after each heat treatment was checked with use of an optical microscope, alteration of the surface of the switch layer after the heat treatment for one hour at 400° C. was recognized. Thus, it was found that the switch device that included the switch layer including GeAsSe had low heat resistance and was not able to resist the semiconductor process in which a heat load corresponding to for one hour 400° C. was applied, resulting in deterioration in the switch device characteristics.

About Heat Resistance

The heat resistance in the experimental examples 1-2 to 1-10 was checked, and in the switch device in which the switch layer included an elemental composition not including B and C such as GaGeAsSe in the experimental example 1-2 and GaGeAsSeN in the experimental example 1-5, as with GeAsSe in the experimental example 1-1, alteration was recognized on the surface of the switch layer after the heat treatment for one hour at 400° C., and the switch device characteristics were not obtained (evaluation C). In contrast, in the switch device in which the switch layer included an elemental composition including B and C such as BCGeAsSe in the experimental example 1-3, BCGeAsSeN in the experimental example 1-7, BCGaGeAsSe in the experimental example 1-8, BCGaGeAsSeN in the experimental example 1-9, and BCGaSiAsSeN in the experimental example 1-10, alteration was not recognized on the surface of the switch layer after the heat treatment for one hour at 400° C., and favorable switch device characteristics were obtained (evaluation A). That is, it was found that adding B and C to the switch layer made it possible to improve heat resistance. In addition, in BCGaAsSe in the experimental example 1-4 and BCGaGeSeN in the experimental example 1-6, even though the switch layer included B and C, alteration was slightly recognized on the surface of the switch layer after the heat treatment for one hour at 400° C. In addition, in the experimental examples 1-4 and 1-6, the number of times of repetition was decreased, as compared with the experimental example 1-3 and the experimental examples 1-7 to 1-10. As described in detail later, it is considered that this result is caused by not adding Ge or Si, and As in each of the experimental examples 1-4 and 1-6.

The simple substances of B and C have a high melting point, and a compound of B and a compound C also have a high melting point. In addition, B and C each have a small atomic radius as compared with other elements. Accordingly, it is considered that a plurality of elements having different atomic radii is included in an amorphous structure by adding B and C, which stabilizes the amorphous structure. Accordingly, it is inferred that alteration after the heat treatment for one hour at 400° C. corresponding high temperature treatment in a typically used semiconductor process was suppressed, which made it possible to favorably maintain characteristics as the switch device.

About Drift Index and Number of Times of Repetitive Operation

The Drift index and the number of times of repetitive operation were checked in each of the experimental example 1-3 and the experimental examples 1-7 to 1-10 in which the switch operation was able to be recognized after the heat treatment for one hour at 400° C., and a favorable Drift index was obtained in BCGaGeAsSe in the experimental example 1-8, BCGaGeAsSeN in the experimental example 1-9, and BCGaSiAsSeN in the experimental example 1-10. In contrast, in BCGeAsSe in the experimental example 1-3 and BCGeAsSeN in the experimental example 1-7, the Drift index had a large value. As can be seen from this, the Drift was suppressed by adding Ga to the switch layer including Se as a main element. In addition, BCGaAsSe in the experimental example 1-4 included Ga, but a favorable Drift index and a favorable number of times of repetitive operation were not obtained. It is inferred that this was because Ge or Si was not added. In BCGaGeSeN in the experimental example 1-6, Ga was included, but As was not added; therefore, it is inferred that favorable switch device characteristics were not obtained as with the experimental example 1-4.

It is considered that in the switch layer including Se as a main element, As is included to be strongly bonded to Se as is known by a compound such as $As_2Se_3$, which stabilizes the amorphous structure. In addition, regarding Ge, in a ternary system including Se, As, and Ge, a stable amorphous structure is formed. Effects similar to those of Ge are expectable in Si that is an element in the same group as Ge. Even in a case where both Ge and Si are added, similar effects are expectable, and an improvement in heat resistance was able to be recognized in the experimental example 1-10. Consequently, it is considered that adding As, and Ge or Si together with Se improves heat resistance of the switch layer and makes it possible to obtain a switch device having stable switch operation. In addition, the favorable Drift index and the favorable number of times of repetitive operation e obtained in the experimental examples 1-7 to 1-10; therefore, it is considered that further adding Ga to the switch layer makes it possible to suppress the drift that is temporal change in the switching threshold voltage and a decrease in threshold voltage caused by deterioration after repetitive operation. This is because, as described above, Ga is added to be strongly bonded to As and Se as is known by a compound such as $Ga_2Se_3$ and GaAs, which stabilizes the amorphous structure. Accordingly, it is considered that even in a case where an electric field associated with the switch device operation was applied, a stable amorphous structure that was resistant to structure change and atomic variation was achieved.

As described above, it was found that in the switch device using Se as a chalcogen element, forming the switch layer using at least one kind of Ge or Si, As, B, C, and Ga made it possible to prevent alteration of the switch layer even through high temperature treatment at about 400° C. that was a typical semiconductor process and favorably maintain various characteristics such as change in the threshold voltage caused by repetitive operation and the Drift.

Figure 17:
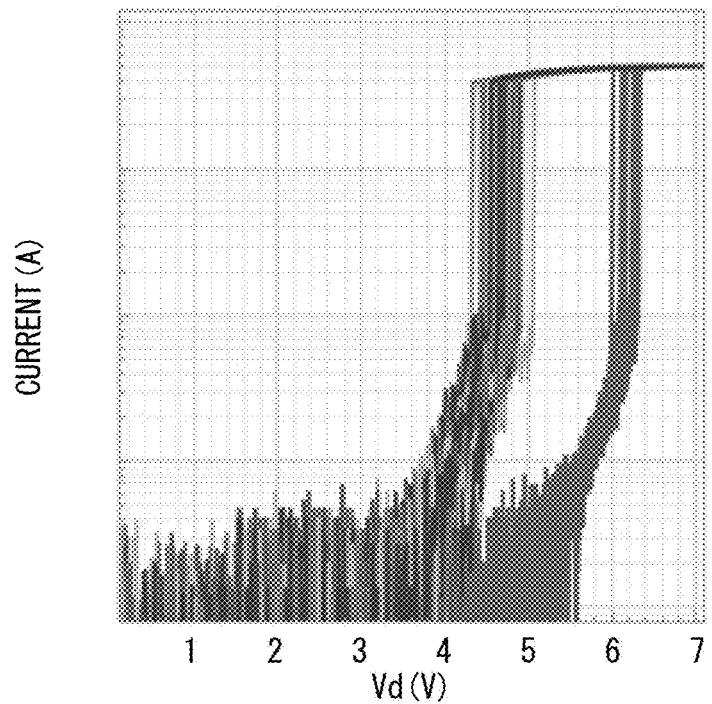
FIG. 17 is an IV characteristic chart in an experimental example 1-8.
Figure 18:
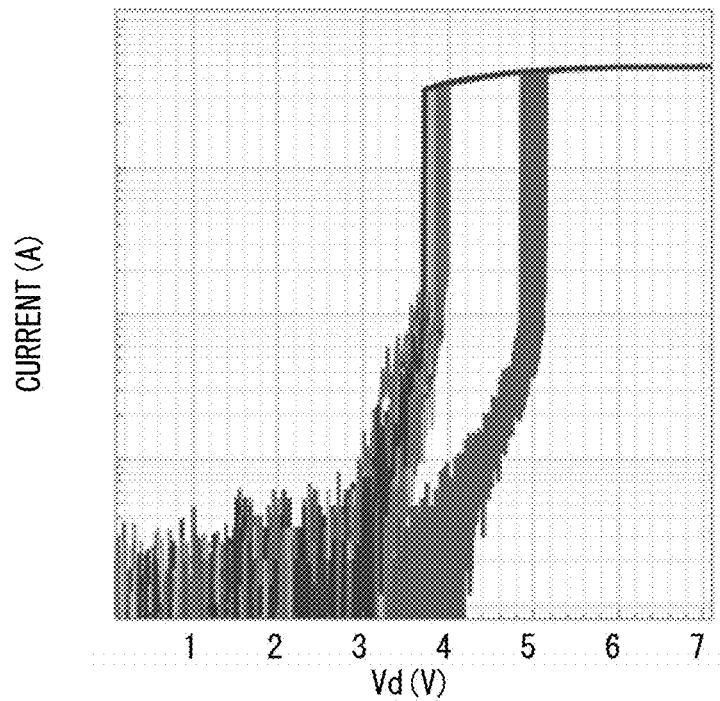
FIG. 18 is an IV characteristic chart in an experimental example 1-9.

In addition, FIG. 17 illustrates an IV curve representing current-voltage characteristics of the experimental example 1-8, and FIG. 18 illustrates an IV curve representing current-voltage characteristics of the experimental example 1-9. In a comparison between FIG. 17 and FIG. 18, it was found that in the experimental example 1-9 in which the switch layer included N, variation in threshold value operation was suppressed more than in the experimental example 1-8 in which the switch layer did not include N. It is considered that N is an element in the same group as As; therefore, N formed a strong bond with Se and Ga, and a bond is formed in amorphous also with N and Ge, which stabilized the amorphous structure. It is to be noted that even in a case where N was not included, substantially equal characteristics were obtained in the experimental example 1-8 formed in a range of the elemental composition described above therefore, it was found that effects of the present disclosure were achievable with the elemental composition described above even in a case where N was not included.

Experiment 2

Next, switch devices having a configuration similar to that in the experimental example 1-9 were fabricated, except that the film thickness of the switch layer was changed to 1 nm, 3 nm, 5 nm, 7 nm, 10 nm, 20 nm, 30 nm, and 50 nm, and switch device characteristics of the switch devices were evaluated.

As can be seen m this experiment, in a case where the film thickness of the switch layer exceeds 30 nm, the threshold voltage becomes too high. Further, film peeling of the switch layer was recognized in a film peeling test. In addition, in a case where the film thickness of the switch layer was 1 nm, the threshold voltage was decreased, and deterioration in switch device characteristics such as leakage and variation in the threshold voltage was recognized. It is considered that this result is caused by the following reason. A high temperature process is performed on the switch device including a chalcogen element as a main element, which causes an element (an electrode element) included in an electrode to be diffused to the switch layer. It is considered that in a case where the film thickness of the switch layer is thin, the electrode element is diffused to the entire switch layer, which significantly changes the characteristics. Accordingly, it can be said that the film thickness of the switch layer included in the switch device of the present disclosure is changed depending on characteristics of a combined memory device in the memory cell array, and is preferably from 3 nm to 30 nm both inclusive, and more preferably from 10 nm to 20 nm both inclusive, for example.

Experiment 3

Figure 19:
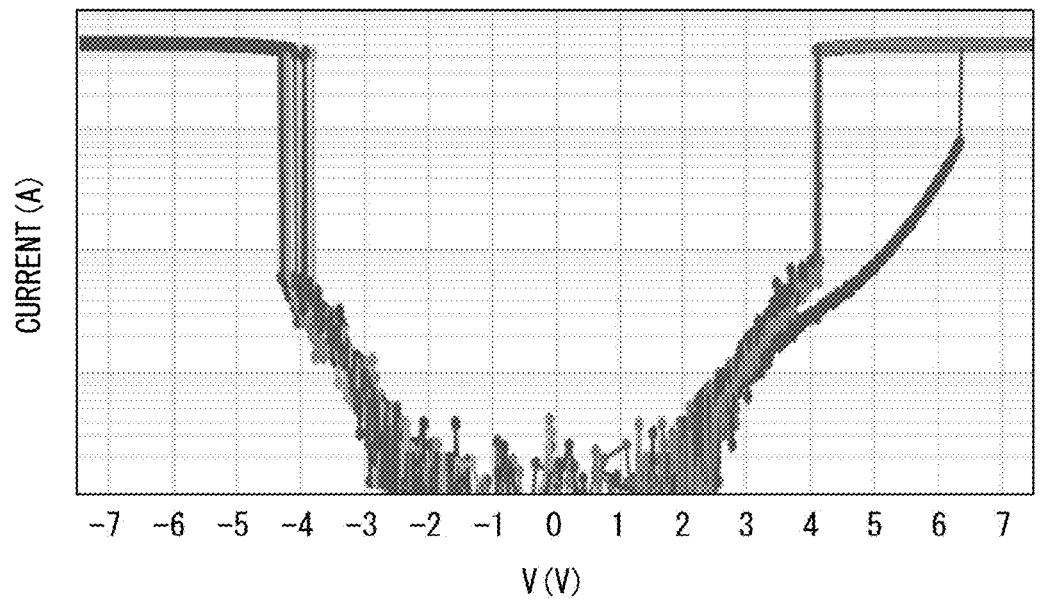
FIG. 19 is a characteristic chart illustrating an operation example at positive and negative voltages in an experimental example 1-4.

FIG. 19 illustrates an IV curve at positive and negative voltages of a switch device in which the switch layer included an elemental composition of BCGaGeAsSeN with a film thickness of 15 nm, and the upper electrode and the lower electrode each included a carbon electrode with a film thickness of 15 nm. In the experiment 1 and the experiment 2, the lower electrode and the upper electrode used materials different from each other; however, it was found that the upper electrode and the lower electrode including the same material and having the same configuration made it possible to obtain switch operation symmetric at positive and negative voltages, as described above.

Experiment 4

Figure 20:
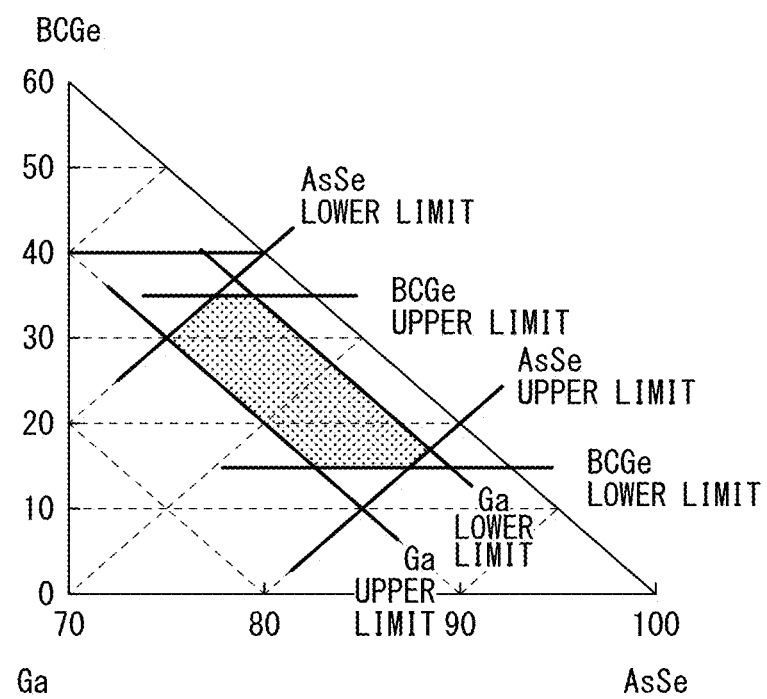
FIG. 20 illustrates composition ranges of elements included in a switch layer.

Next, composition ranges allowing for achievement of the effects of the present disclosure were examined in the elemental composition of BCGaGeAsSeN, FIG. 20 illustrates composition ranges compatible between heat resistance after heat treatment for one hour at 400° C. and the switch device characteristics in a case where BCGaGeAsSeN was separated into three groups, that is, BCGe, Ga, and AsSe, and a content ratio thereof was changed. It is to be noted that the switch device characteristics compatible with heat resistance were determined from variation in threshold voltage, change in threshold voltage after repetitive operation, and the Drift.

A favorable result was obtained in a case where the content of B, C, and Ge (B+C+Ge) was from 15 at % to 35 at % both inclusive, the total content (B+C) of B and C was from 5 at % to 20 at % both inclusive, the content of Ge was from 5 at % to 20 at %, and a ratio of B and C was $0 \leq C/(C+B) \leq 0.2$ In a case where the content of BCGe was less than 15 at % of the total, heat resistance was deteriorated and alteration was recognized on the surface of the switch layer after heat treatment for one hour at 400° C. In a case where the content of BCGe was greater than 35 at %, the threshold voltage itself was greatly increased to exceed an operation voltage in an appropriate range, and variation in the threshold voltage was increased. In addition, in a case where BC was less than 5 at %, deterioration in heat resistance was recognized. In a case where BC was greater than 20 at %, the threshold voltage itself was increased to exceed the operation voltage in the appropriate range, and variation in the threshold voltage was increased. In a case where Ge was less than 5 at %, the heat resistance was deteriorated, and variation in threshold voltage was increased. In a case where Ge was greater than 20 at %, a leakage current was increased, in addition, a content ratio of C to the content of BC in C/(C+B) was greater than 0.2, the leakage current was increased, and the switch device characteristics were deteriorated.

In a case where the content of Ga was less than 2 at % of the total, Drift characteristics were deteriorated. In a case where the content of Ga was greater than 10 at % of the total, the leakage current was increased. In addition, the total content (As+Se) of As and Se from 60 at % to 80 at % both inclusive, the content of As from 20 at % to 40 at % both inclusive, and the content of Se from 30 at % to 50 at % both inclusive made it possible to obtain a favorable result. In a case where the content of AsSe was less than 60 at % of the total, detective operation was recognized. In a case where the content of AsSe was greater than 80 at % of the total, the melting point was decreased, and heat resistance was deteriorated. In addition, in a case where the content of As was less than 20 at % of the total, the heat resistance was deteriorated, and the number of times of repeatable operation was greatly decreased. In a case where the content of As was greater than 40 at % of the total, favorable switch device characteristics were not obtained. Further, in a case where the content of Se was less than 30 at % of the total, the switch device characteristics became unstable, and in a case where the content of Se was greater than 50 at %, the heat resistance was significantly deteriorated.

It is to be noted that in a case where N was added, the content of N being 30 at % or less of the total made it possible to obtain favorable characteristics such as suppression of variation in threshold voltage and an improvement in heat resistance. However, in a case where the content of N exceeded 30 at %, film quality of the switch layer was deteriorated, film peeling occurred during the process, and deterioration in heat resistance was recognized. In addition, Si is an element in the same group as Ge, and has similar properties. Accordingly, it is easily inferred that even in a case where Ge is replaced with Si or even in a case where both Ge and Si are included, similar effects are achievable in composition ranges similar to those in a case where only Ge is added.

Although the description has been given with reference to the embodiment, the modification examples thereof, and the examples, the contents of the present disclosure are not limited to the embodiment and the like described above, and may be modified in a variety of ways. It is to be noted that the effects described in the present specification are merely illustrative. Effects achieved by the present disclosure are not limited to the effects described in the present specification. The contents of the present disclosure may have effects other than the effects described in the present specification.

In addition, for example, the present disclosure may have the following configurations (1)

A switch device including:

a first electrode;

a second electrode opposed to the first electrode; and a switch layer including selenium (Se), at least one kind of germanium (Ge) or silicon (Si), boron (B), carbon (C), gallium (Ga), and arsenic (As), and provided between the first electrode and the second electrode.

(2)

The switch device according to (1), in which the switch layer includes the carbon (C), the boron (B), the germanium (Ge), and the silicon (Si) in a range from 15 at % to 35 at % both inclusive of the carbon (C), the boron (B), and the germanium (Ge) or the silicon (Si) or both the germanium (Ge) and the silicon (Si), a range from 5 at % to 20 at % both inclusive of a combination of the carbon (C) and the boron (B), and a range from 0 to 0.2 both inclusive of a ratio of the carbon (C) to a total of the carbon (C) and the boron (B), the gallium (Ge) is included in a range from 2 at % to 10 at % both inclusive, and the arsenic (As) and the selenium (Se) are included in a range from 60 at % to 80 at % both inclusive of the arsenic (As) and the selenium (Se), a range from 20 at % to 40 at % both inclusive of the arsenic (As), and a range from 30 at % to 50 at % both inclusive of the selenium (Se).

(3)

The switch device according to (1) or (2), in which the switch layer further includes nitrogen (N).

(4)

The switch device according to (3), in which the nitrogen (N) is included in a range of 30 at % or less of all elements included in the switch layer.

(5)

The switch device according to any one of (1) to (4), in which a film thickness of the switch layer is from 3 nm to 30 nm both inclusive.

(6)

The switch device according to any one of (1) to (4), in which a film thickness of the switch layer is from 10 nm to 20 nm both inclusive.

(7)

The switch device according to any one of (1) to (6), in which a layer consisting of carbon (C) or a layer including carbon (C) is provided between the switch layer and at least one of the first electrode or the second electrode.

(8)

The switch device according to any one of (1) to (7), in which without involving phase change between an amorphous phase and a crystal phase, the switch layer is changed to a low-resistance state by an increase in an application voltage to a predetermined threshold voltage or higher, and is changed to a high-resistance state by a decrease in the application voltage to a voltage that is lower than the threshold voltage.

(9)

A storage apparatus provided with one or a plurality of memory cells, each of the memory cells including a memory device and a switch device directly coupled to the memory device, the switch device including:

a first electrode;

a second electrode opposed to the first electrode and a switch layer including selenium (Se), at least one kind of germanium (Ge) or silicon (Si), boron (B), carbon (C), gallium (Ga), and arsenic (As), and provided between the first electrode and the second electrode.

(10)

The storage apparatus according to (9), in which the one or the plurality of memory cells is disposed along one or a plurality of first wiring lines extending in one direction, one or a plurality of second wiring lines extending in another direction and intersecting with the first wiring lines, and at intersection points of the first wiring lines and the second wiring lines.

(11)

The storage apparatus according to (9) or (10), in which the memory device includes any one of a phase-change memory device, a resistance-change memory device, and a magnetoresistive memory device.

(12)

The storage apparatus according to any one of (9) to (11), in which two or more of the plurality of memory cells are stacked.

(13)

A memory system provided with a host computer, a memory, and a memory controller, the host computer including a processor, the memory including a memory cell array that includes a plurality of memory cells, the memory controller that performs control of a request to the memory in accordance with a command from the host computer, each of the plurality of memory cells including a memory device and a switch device directly coupled to the memory device, the switch device including:

a first electrode;

a second electrode opposed to the first electrode; and a switch layer including selenium (Se), at least one kind of germanium (Ge) or silicon (Si), boron (B), carbon (C), gal (Ga), and arsenic (As), and provided between the first electrode and the second electrode.

This application claims the benefit of Japanese Priority Patent Application JP2018-037817 filed with Japan Patent Office on Mar. 2, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof

What is claimed is:

1. A switch device, comprising:

a first electrode;

a second electrode opposed to the first electrode; and a switch layer including selenium (Se), at least one kind of germanium (Ge) or silicon (Si), boron (B), carbon (C), gallium (Ga), and arsenic (As), and provided between the first electrode and the second electrode, wherein the switch layer includes the carbon (C), the boron (B), the germanium (Ge), and the silicon (Si) in a range from 15 atomic percent (at %) to 35 at % both inclusive of the carbon (C), the boron (B), and the germanium (Ge) or the silicon (Si) or both the germanium (Ge) and the silicon (Si), a range from 5 at % to 20 at % both inclusive of a combination of the carbon (C) and the boron (B), and a range from 0 to 0.2 both inclusive of a ratio of the carbon (C) to a total of the carbon (C) and the boron (B), wherein the gallium (Ge) is included in a range from 2 at % to 10 at % both inclusive, and wherein the arsenic (As) and the selenium (Se) are included in a range from 60 at % to 80 at % both inclusive of the arsenic (As) and the selenium (Se), a range from 20 at % to 40 at % both inclusive of the arsenic (As), and a range from 30 at % to 50 at % both inclusive of the selenium (Se).

2. The switch device according to claim 1, wherein the switch layer further includes nitrogen (N).

3. The switch device according to claim 2, wherein the nitrogen (N) is included in a range of 30 at % or less of all elements included in the switch layer.

4. The switch device according to claim 1, wherein a film thickness of the switch layer is from 3 nm to 30 nm both inclusive.

5. The switch device according to claim 1, wherein a film thickness of the switch layer is from 10 nm to 20 nm both inclusive.

6. The switch device according to claim 1, wherein a layer consisting of carbon (C) or a layer including carbon (C) is provided between the switch layer and at least one of the first electrode or the second electrode.

7. The switch device according to claim 1, wherein without involving phase change between an amorphous phase and a crystal phase, the switch layer is changed to a low-resistance state by an increase in an application voltage to a predetermined threshold voltage or higher, and is changed to a high-resistance state by a decrease in the application voltage to a voltage that is lower than the threshold voltage.

8. A storage apparatus provided with one or a plurality of memory cells, each of the memory cells including a memory device and a switch device directly coupled to the memory device, the switch device comprising:
- a first electrode;
- a second electrode opposed to the first electrode; and
- a switch layer including selenium (Se), at least one kind of germanium (Ge) or silicon (Si), boron (B), carbon (C), gallium (Ga), and arsenic (As), and provided between the first electrode and the second electrode, wherein the switch layer includes the carbon (C), the boron (B), the germanium (Ge), and the silicon (Si) in a range from 15 atomic percent (at %) to 35 at % both inclusive of the carbon (C), the boron (B), and the germanium (Ge) or the silicon (Si) or both the germanium (Ge) and the silicon (Si), a range from 5 at % to 20 at % both incisive of a combination of the carbon (C) and the boron (B), and a range from 0 to 0.2 both inclusive of a ratio of the carbon (C) to a total of the carbon (C) and the boron (B), wherein the gallium (Ge) is included in a range from 2 at % to 10 at % both inclusive, and wherein the arsenic (As) and the selenium (Se) are included in a range from 60 at % to 80 at % both inclusive of the arsenic (As) and the selenium (Se), a range from 20 at % to 40 at % both inclusive of the arsenic (As), and a range from 30 at % to 50 at % both inclusive of the selenium (Se).

9. The storage apparatus according to claim 8, wherein the one or the plurality of memory cells is disposed at intersection points of first wiring lines and second wiring lines.

10. The storage apparatus according to claim 8, wherein the memory device includes any one of a phase-change memory device, a resistance-change memory device, and a magnetoresistive memory device.

11. The storage apparatus according to claim 8, wherein two or more of the plurality of memory cells are stacked.

12. A memory system provided with a host computer, a memory, and a memory controller, the host computer including a processor, the memory including a memory cell array that includes a plurality of memory cells, the memory controller that performs control of a request to the memory in accordance with a command from the host computer, each of the plurality of memory cells including a memory device and a switch device directly coupled to the memory device, the switch device comprising:
- a first electrode;
- a second electrode opposed to the first electrode; and
- a switch layer including selenium (Se), at least one kind of germanium (Ge) or silicon (Si), boron (B), carbon (C), gallium (Ga), and arsenic (As), and provided between the first electrode and the second electrode, wherein the switch layer includes the carbon (C), the boron (B), the germanium (Ge), and the silicon (Si) in a range from 15 atomic percent (at %) to 35 at % both inclusive of the carbon (C), the boron (B), and the germanium (Ge) or the silicon (Si) or both the germanium (Ge) and the silicon (Si), a range from 5 at % to 20 at % both inclusive of a combination of the carbon (C) and the boron (B), and a range from 0 to 0.2 both inclusive of a ratio of the carbon (C) to a total of the carbon (C) and the boron (B), wherein the gallium (Ge) is included in a range from 2 at % to 10 at % both inclusive, and wherein the arsenic (As) and the selenium (Se) are included in a range from 60 at % to 80 at % both inclusive of the arsenic (As) and the selenium (Se), a range from 20 at % to 40 at % both inclusive of the arsenic (As), and a range from 30 at % to 50 at % both inclusive of the selenium (Se).

* * * * *